United States Patent [19]

Kimura et al.

[11] Patent Number: 5,311,177
[45] Date of Patent: May 10, 1994

[54] CODE TRANSMITTING APPARATUS WITH LIMITED CARRY PROPAGATION

[75] Inventors: Tomohiro Kimura; Fumitaka Ono; Masayuki Yoshida; Shigenori Kino, all of Kamakura, Japan

[73] Assignee: Mitsubishi Denki Kabushiki Kaisha, Tokyo, Japan

[21] Appl. No.: 901,762

[22] Filed: Jun. 19, 1992

[30] Foreign Application Priority Data

Nov. 15, 1991 [JP] Japan .................. 3-300486

[51] Int. Cl.$^5$ ............................. H03M 7/00
[52] U.S. Cl. ............................ 341/51; 341/107
[58] Field of Search ............ 341/51, 65, 67, 107

[56] References Cited

U.S. PATENT DOCUMENTS

| | | | |
|---|---|---|---|
| 4,891,643 | 1/1990 | Mitchell et al. | 341/107 |
| 4,933,883 | 6/1990 | Pennebaker et al. | 364/554 |
| 4,973,961 | 11/1990 | Chamzas et al. | 341/51 |
| 4,989,000 | 1/1991 | Chevion et al. | 341/107 |
| 5,059,976 | 10/1991 | Ono et al. | 341/51 |

FOREIGN PATENT DOCUMENTS

| | | |
|---|---|---|
| 0205667 | 12/1986 | European Pat. Off. |
| 258812 | 8/1987 | Japan . |
| 344116 | 2/1991 | Japan . |

OTHER PUBLICATIONS

Mitchell et al., "Software Implementations of the Q-- Coder", IBM Journal of Research and Development, vol. 32, No. 6, Nov. 1988, pp. 753-774.

Primary Examiner—Marc S. Hoff
Attorney, Agent, or Firm—Wolf, Greenfield & Sacks

[57] ABSTRACT

Although data is transmitted with efficiency by an arithmetic encoding system, the number of carry control signals increases in proportion to the number of consecutive bits "1"s or bytes X'FF's in a conventional system. In the present invention, an arithmetic encoder 302 'detects the possibility of a carry generated during arithmetic coding operation being propagated beyond at least a predetermined number of consecutive bytes X'FF's in a supplied arithmetic code 315. When the propagation of the carry is impossible, a carry control signal is inserted into the first 2 bits of the byte other than X'FF' which occurs immediately after the consecutive bytes X'FF's so as to transmit the presence or absence of a carry. An arithmetic decoder 303 detects the continuation of at least a predetermined number of bytes X'FF's in the arithmetic code 315, and arithmetically decodes an output value YN316 on the basis of the predicted value MPS317 of the occurrence probability of the output value YN316 to be encoded and the region width Qe of the complementary predicted value LPS. Since the number of total bits of the inserted carry control signals is reduced by this "one-time 2-bits insertion system", the total number of transmitted code bits is also reduced.

18 Claims, 46 Drawing Sheets

STRUCTURE OF F-REGISTER OF ENCODER
(ONE-TIME 2-BITS INSERTION SYSTEM)

| 1's RUN LENGTH (L) | NUMBER OF BITS INSERTED BY A CONVENTIONAL SYSTEM (EVERY-TIME BIT INSERTION SYSTEM) | NUMBER OF BITS INSERTED BY THE SYSTEM OF THE INVENTION (ONE-TIME BIT INSERTION SYSTEM) |
|---|---|---|
| $0 \leq L < m$ | 0 | 0 |
| $m \leq L < 2m$ | 1 | |
| $2m \leq L < 3m$ | 2 | 2 |
| ⋮ | ⋮ | |
| $(k-1)m \leq L < km$ | $k-1$ | |
| ⋮ | ⋮ | | m : MAXIMUM ADMISSIBLE NUMBERS OF CARRIES TO BE PROPAGATED.

Fig. 23

CODE TRANSMITTING APPARATUS WITH LIMITED CARRY PROPAGATION

BACKGROUND OF THE INVENTION

1. Field of the Invention

The present invention relates to an arithmetic coding method. More particularly, the present invention relates to a code transmitting apparatus for transmitting an arithmetic code while limiting the carries to be propagated to a predetermined number by controlling the propagation of a carry produced during the encoding operation by a carry control signal.

2. Description of the Related Art

An arithmetic coding method is known as one of the data compressing/expanding methods. In a general arithmetic coding method, a predetermined effective region is first set in an interval between 0 and 1 on a number line (hereinunder often referred to as "probability number line"). The predetermined effective region is then divided into some regions in accordance with the occurrence probability ratio of each symbol in an input data list which is the object of encoding. The input data are encoded in a computing process for updating the effective region in accordance with the input data. By repeating the computing process for updating, the data are serially encoded.

EXAMPLE 1

An example of a conventional encoding apparatus will be explained with reference to FIG. 24. FIG. 24 is a block diagram of the structure of the conventional encoding apparatus described in the specification of Japanese Patent Application No. Hei 1-178632. The receiving system is shown by analogy by the present inventors An arithmetic encoding means 101 encodes a symbol stream 110 being encoded which is supplied from an information source, and outputs an encoded signal 120 and a carry signal 130. A carry transmission control means 102 of an every-time 1-bit insertion system monitors the encoded signal 120 and the carry signal 130, and limits the carries to be propagated from the adjacent digit to a predetermined number by an every-time 1-bit insertion system, and outputs the resulting code bit stream 140 (the encoded signal 120 in which the carries to be propagated are limited to a predetermined number) to a transmission path.

A carry reception control means 103 of an every-time 1-bit insertion system receives the code bit stream 140 from the transmission path. By monitoring the code bit stream 140, the carry reception control means 103 detects the presence or absence of a digit shifted from the adjacent digit, and outputs a decoded signal 150 and a control bit detection signal 160. An arithmetic decoding means 104 generates a decoded symbol stream 170 by using the decoded signal 150 and the control bit detection signal 160. At the time of generation of the decoded symbol stream 170, the carries which have been prevented from being propagated during the encoding operation are propagated again.

In this conventional code transmitting apparatus, a carry propagation absorbing control bit "0" is inserted in the code bit stream 140 at intervals of a predetermined 1's run length (predetermined number of consecutive code bits "1"s). This propagation absorbing control bit "0" becomes bit "1" when the carry control signal absorbs a carry.

FIG. 25 is a flowchart of the operation of the arithmetic encoding means 101. As shown in FIG. 25, every time a symbol of the symbol stream 110 is encoded, the effective region width A on the probability number line is divided into a region width A(1) of a less probable symbol (LPS) and a region width A(0) of a more probable symbol (MPS) in proportion to the occurrence probability ratio of the symbol (step S101).

The binary fraction in the effective region width A is stored in a region register. The less probable symbol (LPS) refers to a symbol having a small occurrence probability, for example, "1". The more probable a symbol having a large occurrence probability, for example, "0". The region width A(1) is obtained by approximating the occurrence probability of the less probable symbol (LPS) "1", for example, with the reciprocal of the n-th power of 2, and the region width A(0) is obtained by subtracting A(1) from A.

At step S102, judgment is made as to whether or not the symbol SY is superior ("0") or inferior ("1"). When the symbol SY is superior, the lower boundary value CR of the current effective region is added to A(1), thereby updating the lower boundary value CR of the current effective region (step S103).

The binary fraction of the lower boundary value CR of the effective region is stored in an encoding register.

On the other hand, when the symbol SY is inferior, the lower boundary value CR is retained without being updated, and A is updated to A(1) (step S104).

If $A \leq \frac{1}{2}$ after the above computation, the region register (in which the effective region width A is stored) together with the encoding register (in which the lower boundary value CR of the effective region is stored) is renormalized by a shift left logical (SLL) operation until the relationship $A > \frac{1}{2}$ is satisfied (step S106).

After the computation at the step S104, since the relationship $A \leq \frac{1}{2}$ is always satisfied, the above-described renormalization process is executed at the step S106. On the other hand, after the computation at the step S103, judgment is first made as to whether or not $A \leq \frac{1}{2}$ at step S105, and if $A \leq \frac{1}{2}$, the renormalization process is executed at the step S106.

The encoded signal 120 is composed of the most significant bit shifted out of the encoding register by the shift left logical operation. The most significant bit constituting the encoded signal 120 is called a code bit C. The carry signal 130 is a signal indicating the presence or absence of the carry from the adjacent digit which is to be propagated beyond the most significant bit of the encoding register. The bit constituting the carry signal is called CRY, and if the carry operation is necessary, CRY=1, while if the carry operation is unnecessary, CRY=0. Both of the encoded signal 120 and the carry signal 130 are supplied to the carry transmission control means 102.

In this way, the encoded signal 120 and the carry signal 130 are generated during the computing process for renormalization at the step S106. At step S107, judgment is made as to whether or not $A \leq \frac{1}{2}$. If $A \leq \frac{1}{2}$, the renormalization step S106 is continuously carried out until the relationship $A > \frac{1}{2}$ is satisfied.

As described above, it is when the carry operation is necessary that the CRY "1" is transmitted. The carry operation is necessary only at the time of the initialization of the renormalization. In other words, the carry operation is carried out only when the process proceeds from the step S104 or step S105 to the step S106 and the digit is shifted by the first SLL operation. At this time, since the code bit C is constantly "0", the encoding register length must be longer than the region register length.

The above-described process is repeated until the last bit of the symbol stream 110 as the object of encoding (step S108).

FIG. 26 is a flowchart of the operation of the carry transmission control means 102 (hereinunder referred to as "transmission control means 102") of an every-time 1-bit insertion system.

As shown in FIG. 26, the code bit C of the encoded signal 120 and the bit CRY of the carry signal 130 are first monitored at step S201. At the same time, the transmission control means 102 counts a 1's run length j which has been transmitted to the transmission path and a 1's run length k in the encoded signal 120 which is waiting for the command for transmission in the transmission control means 102.

At step S202, judgment is made as to whether or not there is a carry from the adjacent digit. If the answer is in the affirmative, the process proceeds to step S204, while if the answer is in the negative, the process proceeds to step S212.

At the step S204, the maximum admissible number of carries to be propagated is compared with the 1's run length j which has been transmitted to the transmission path. If $j < m-1$, the process proceeds to step S205, while if $j > m-1$ (i.e., $j = m$), the process proceeds to step S209.

At the step S205, a carry inversion bit pattern 10 . . . 0 of $(k+1)$ bits is transmitted to the transmission path. At step S206, whether or not $k=0$ is judged. If $k=0$, 1 is added to j at step S207, and if $k \neq 0$, j is reset (substituted by "0") at step S208. Thus, the 1's run at a code bit 0 is finished.

At step S209, a carry inversion bit pattern 100 . . . 0 of $(k+2)$ bits is transmitted to the transmission path (since j becomes equal to m due to the first bit "1", the carry propagation absorbing control bit "0" is inserted immediately after the first bit "1"). Thereafter, j is reset irrespective of the value k.

After the computing processings at the steps S207, S208 and S209, the process proceeds to step S211, and "0" is substituted into k.

Due to these processings at the steps S204, S205 to S208, S209 and S211, the current bit $C=0$ becomes the first bit of the next waiting bit pattern "01 . . . 1".

If there is no carry, the process proceeds to step S211, as described above, and whether or not $C=1$ is judged. If $C=1$, the process proceeds to step S214, and if $C \neq 1$, the process proceeds to step S219.

At the step S214, 1 is added to k. At step S215, judgment is made as to whether or not $k=m$, and if the answer is in the affirmative, the process proceeds to step S216. If the answer is in the negative, the process proceeds to step S222.

At step S216, a no-carry inversion bit pattern 01 . . . 1 of $(m+1)$ bits is transmitted to the transmission path, m is substituted into j, and k is reset (substituted by "0"). The carry propagation absorbing control bit "0" is inserted immediately after the thus-transmitted no-carry inversion bit pattern. For the control bit "0", the first bit of the next waiting bit pattern "01 . . . 1" is utilized. If $k \neq m$ after 1 is added to k, the no-carry inversion bit pattern is not transmitted but left waiting.

If $C=0$, the process proceeds to the step S219, as described above, and a no-carry inversion bit pattern 01 . . . 1 of $(k+1)$ bits is transmitted to the transmission path, k is substituted into j, and k is reset (substituted by "0"). The relationship $C=0$ is realized by utilizing the first bit of the next waiting bit pattern "01 . . . 1".

These processings are repeated until the last bit of the encoded signal 120 supplied from the arithmetic encoding means 101 (step S222).

FIG. 27 is a flowchart of the operation of the carry reception control means 103 (hereinunder referred to as "reception control means 103") of an every-time 1-bit insertion system.

As shown in FIG. 27, the carry reception control means 103 first monitors the received bit D of the code bit stream 140 at step 301 and counts a "1"'s run length h of the code bit stream 140. The reception control means 103 compares h with m, and if $h < m$, the process proceeds to step S302, otherwise the process proceeds to step S307.

At the step S302, judgment is made as to whether or not $D=1$. If $D=1$, 1 is added to h, and the bit DET of the control bit detection signal 160 is set to 0 (step S303). On the other hand, if $D=0$, h is reset (substituted by "0", and the bit DET is set to 0 (step S304).

At the step S307, h is reset (substituted by "0"), and the current bit D is regarded as the carry propagation absorbing control bit "0" or "1", and the bit DET is set to 1.

After the computing processings at the steps S303, S304 and S307, the decoded signal 150 constituted by D (hereinunder D is often referred to as "decoding bit") and the control bit detection signal 160 are supplied to an external equipment at step S308. These processings are repeated until the last bit of the code bit stream 140 supplied from the transmission path (step 309).

FIG. 28 is a flowchart of the operation of the arithmetic decoding means 104. As shown in FIG. 28, the arithmetic decoding means 104 first divides the effective region width A into A(0) and A(1) by the same process as in the arithmetic encoding means 101 at step 401 every time a symbol of the encoded symbol stream 110 which is the object of decoding is decoded.

Judgment is then made as to whether or not the first plural digits DR (the binary fraction to be stored in the decoding register) at the left of the current decoding bit D in the decoded signal 150 is not less than A(1). If the answer is in the affirmative, the process proceeds to step S403, otherwise the process proceeds to step S404.

At the step S403, a more probable symbol (MPS) is decoded and A(1) is subtracted from the first plural digits DR at the left. Thereafter A(0) is substituted into A (i.e., A is updated to A(0)).

If the plural digits DR is less than A(1), the process proceeds to the step S404, as described above, and a less probable symbol (LPS) is decoded. DR is retained as it is, and A(1) is substituted into A (i.e., A is updated to A(1)).

After the processings at the steps S403 and S404, the region register together with the decoding register is renormalized by the shift left logical (SLL) operation until the relationship $A < \frac{1}{2}$ is satisfied (steps S404, S407, S408 and S409), in the same way as in the arithmetic coding means 101. At this time, the current decoding bit D of the decoded signal 150 is fetched as the least significant bit of the decoding register. Simultaneously, the current bit DET of the control bit detection signal 160 is fetched, and whether or not DET=0 is judged at the step S407.

If DET="1", no shifting operation is carried out and the decoding bit D is added to the decoding register (step S409). On the other hand, if DET="0", the shifting operation is carried out (step S408).

The renormalization at the steps S404, S407, S408 and S409 is repeated until the relationship $A > \frac{1}{2}$ is satisfied, in the same way as in the arithmetic coding means 101 (step 410). These processings are repeated until the processing of the final bit of the decoded signal 150 is finished.

EXAMPLE 2

In the flowchart (-H is added as a suffix) of the arithmetic coding method shown in, for example, "J. L. Mitchell, W. B. Pennebaker: Software Implementations of the Q-coder", *IBM Journal of Research and Development*, Vol. 32, No. 60, 1988, pp. 753 to 774), an arithmetic code is represented by a fixed point part in the effective region as the coordinate of the lower boundary value of the effective region.

According to this paper, the encoding and decoding operations of an arithmetic code are carried out in the following procedure. It is here assumed that C represents the value of an arithmetic code, A an effective region width, and Qe the region width of an LPS, which is a symbol (symbol value=data value in this paper) having a small occurrence probability q, that the effective region is divided into an LPS region and an MPS region, which is a symbol having a large occurrence probability q, and that the LPS region is positioned below the MPS region on a number line.

```
(Encoding procedure)
If
    MPS is encoded
    C ← C + Qe
    A ← A − Qe
else
    LPS is encoded
    A ← Qe
end.
(Decoding procedure)
If C > Qe
    MPS is decoded
    C ← C − Qe
    A ← A − Qe
else
    LPS is decoded
    A ← Qe
end.
```

The region width Qe of the LPS is obtained as the product of the effective region width A and the occurrence probability q of the LPS. The amount of computation is reduced by dividing the range of the occurrence probability q, namely, the range of not less than 0 to less than 0.5 into some probability regions and fixing the region width Qe of the LPS in each probability region to which the occurrence probability q belongs (for example, approximating the region width Qe with a reciprocal of the n-th power of 2), and the remaining region width (A - Qe) are allotted to the MPS region. The region width Qe of the LPS is obtained by referring to the table while using the probability region as an index.

When the effective region width A updated by computation becomes smaller than a certain value Amin (generally 0.5, in the above-described paper, 0.75), a renormalization process is carried out. In the renormalization process, the effective region width A which is smaller than Amin together with the arithmetic code C is multiplied by 2 until the effective region width A becomes larger than Amin. To multiply the arithmetic code C by 2 means to shift the arithmetic code C by 1 bit. Therefore, whenever the arithmetic code is multiplied by 2 in the renormalization process, an arithmetic code of 1 bit is output. The effective region width A is constantly updated to not less than 0.5 and less than 1 (not less than 0.75 and less than 1.5 in the above-described paper) by renormalization, and even if the region width Qe of the LPS is fixed (Qe<Amin), the MPS region is constantly reserved. The digits which are beyond the capacity of the register used for computation are omitted. In this manner, an error in computation which is caused due to the limited register length can be restricted by renormalization.

FIG. 29 is a block diagram of the structure of a code transmitting apparatus described in, for example, in the above-described paper. As shown in FIG. 29, a model probability generator 1 on the input side outputs an input value YN11 of input data 10 supplied from an information source, the predicted value MPS12 of the occurrence probability of the input value YN11 and the region width Qe14 (or approximate value thereof) of the complementary LPS (the inverted value, i.e., the complement of the predicted value MPS 12). An arithmetic encoder 2 of an every-time 1-bit insertion system outputs an arithmetic code 15 by arithmetic encoding based on the input signal YN 11, the predicted value MPS 12 and the LPS region width Qe14 which are supplied from the model probability generator 1 on the input side. The arithmetic code 15 is supplied after a carry control signal of 1 bit indicating the presence or absence of a carry from the adjacent digit is inserted thereinto every time a byte X'FF' (hexadecimal notation, a hexadecimal number will be represented by "X'n'" hereinunder) occurs. This method is called an every-time 1-bit insertion system, as described above. An arithmetic decoder 3 of an every-time 1-bit insertion system outputs an output value YN16 which is obtained by decoding the arithmetic code 15 supplied from the arithmetic encoder 2 of an every-time 1-bit insertion system. In outputting the output value YN16 by decoding the fetched arithmetic code 15, the arithmetic decoder 3 detects and processes the carry control signal with respect to the predicted value MPS17 of the occurrence probability of the output value YN16 and the LPS region width Qe19 which are generated by a model probability generator 4 on the output side.

The model probability generator 4 on the output side outputs the predicted value MPS17 of the occurrence probability of the output value YN16 and the region width Qe 19 of the complementary LPS (the inverted value, i.e., the complement of the predicted value MPS17), and generates output data 20 from the output value YN16 and supplies it to an external equipment.

The code transmitting apparatus in this example adopts a transmission control system (every time 1-bit insertion system) in which a bit "0" is inserted as a carry control signal of 1 bit into the most significant bit of a byte immediately after the byte X'FF' every time the byte occurs in the arithmetic code being transmitted, so that the carry from the adjacent digit during the arithmetic operation is absorbed (by the bit "0"), thereby preventing the carry from being propagated. When the carry control signal (the bit "0") absorbs the carry, the bit is changed to "1".

The model probability generator 1 on the input side outputs the input value YN11 of the input data 10, the predicted value MPS12 of the occurrence probability of the input value YN11 and the region width Qe14 of the complementary LPS to the arithmetic encoder 2, as shown in FIG. 29. When the renormalization process is carried out by the arithmetic encoder 2, the probability region of the complementary predicted value LPS is changed and the LPS region width Qe14 is updated.

The arithmetic encoder 2 of an every-time 1-bit insertion system encodes the input data YN11 by an arithmetic encoding means 5 of an every-time 1-bit insertion system in accordance with the flowchart shown in FIG. 30. The symbol INITENC represents a routine for initialization at the start of the encoding process. The acquisition of MPS, Qe and YN is realized by receiving the three parameters (the input value YN11, the predicted value MPS12 and the LPS region width Qe14) from the model probability generator 1 on the input side. The symbol ENCODE represents a routine for actually encoding the input data YN 11 by using the received parameters. The acquisition of MPS, Qe and YN and the routine ENCODE are repeated until the end of the input of the parameters. The symbol FLUSH represents a routine for postprocessing of the encoding operation executed after the end of the input of all the parameters.

The arithmetic coder 2 is composed of the above-described group of routines.

The C-register 30 of the arithmetic encoder 2 of an every-time 1-bit insertion system is composed of a register of 32 bits, as shown in FIG. 31. In the C-register 30, the fixed point is provided between bit 11 and bit 12. The C-register 30 is divided into a Cx-register 31 of bit 0 to bit 11, a Cs-register 32 of bit 12 to bit 15, a Cb-register 33 of bit 16 to bit 23 and a Cf-register 34 of bit 24 to bit 31. The LPS region width Qe14 is a register having the same accuracy (same bits) as the Cx-register 31, and the value of the LPS width Qe14 is added to the Cx-register 31. One of the bits 17 to 24 of the Cb-register 33 or the C-register 30 is output to an arithmetic code buffer as the arithmetic code 15. The Cf-register 34 is used for the purpose of indicating the output timing to the arithmetic code buffer. If an output flag is set in the Cf-register 34 and the shifting operation is carried out up to the most significant bit of the C-register 30, it indicates that the arithmetic code 35 of 1 byte is stored and is ready to be written into the arithmetic code butter. An A-register 35 is composed of a register of 16 bits, as shown in FIG. 31, and the fixed point is provided at the same position as in the Cx-register 31. Arithmetic operation is carried out between the value of the A-register 31 and the LPS region width Qe14.

The encoding operation by the arithmetic encoding means 5 of an every-time 1-bit insertion system will be explained with reference to the following flowcharts. The variables and constants used in the flowcharts are as follows:

| | |
|---|---|
| C | C-register value (encoding register) 30 |
| Cx | Cx-register value (bits 0 to 11) 31 |
| Cs | Cs-register value (bits 12 to 15) 32 |
| Cb | Cb-register value (bits 16 to 23) 33 |
| Cf | Cf-register value (bits 24 to 31) 34 |
| A | A-register value (effective region width) 35 |
| YN | input value 11 |
| MPS | predicted value 12 |
| LPS | complementary predicted value |
| Qe | LPS region width 14 |
| B | B-buffer value (byte indicated by a buffer pointer) |
| BP | buffer pointer (indicating the location in the arithmetic code buffer where the arithmetic code is stored) |
| CT | count value for postprocessing (FLUSH) |
| Amin | minimum value of the effective region width (as a renormalization condition) |
| BPST | first address of the arithmetic code buffer |
| LEN | buffer capacity (unit: byte) |
| BE | last address of the arithmetic code buffer |

FIG. 32 is a flowchart of the detailed operation of the INITENC routine for initialization at the start of the encoding process. As shown in FIG. 32, tables are set up and a storage unit is initialized. As described above, each of the registers is operated in the respectively predetermined locations in the memory circuit. Simultaneously, the arithmetic code buffer is secured and set up. The buffer pointer BP indicates the address preceding the first address BPST of the arithmetic code buffer, and the buffer value B is set to a byte X'80' as a value other than a byte X'FF', which has a special meaning. The minimum effective region width Amin is set in the A-register 35 as the initial value and the minimum effective region width Amin is not changed and treated as a constant during the encoding operation. Only an output flag is set in the Cf-register 34 of the C-register 30. Since the arithmetic code to be output in the encoding initiated state is below the Cx-register value 31CX (fixed point part), an output flag is set in the Cb-register 33 (bit 20) so that the first output is supplied when the bit 11 reaches the most significant bit (bit 23) of the Cb-register 33.

FIG. 33 is a flowchart of the detailed operation of the ENCODE routine for actually processing the encoding operation. As shown in FIG. 33, if the input value YN11 obtained from the model probability generator 1 on the input side is "1", a CODEYN1 routine is executed, while if YN11 is "0", a CODEYN0 routine is executed, The detailed operation of the CODEYN1 routine for processing the input value YN11="1" is shown in the flowchart FIG. 34. As shown in FIG. 34, if the predicted value MPS12 is "1", the LPS region width Qe14 is subtracted from the A-register value 35A and the LPS region width Qe14 is added to the C-register value 30C, thereby updating the respective values. When the updated A-register value 35A is smaller than the minimum effective region width Amin, the renormalization process RENORME is executed.

On the other hand, if the predicted value MPS12 is "0", the A-register value 35A is updated to the LPS region width Qe14, the C-register value 30C is not updated, and the renormalization process RENORME is executed.

The detailed operation of the CODEYN0 routine for processing the input value YN11="0" is shown in the flowchart in FIG. 35. As shown in FIG. 35, if the predicted value MPS12 is "0", the LPS region width Qe14 is subtracted from the A-register value 35A and the LPS region width Qe14 is added to the C-register value 30C, thereby updating the respective values. When the updated A-register value 35A is smaller than the minimum effective region width Amin, the renormalization process RENORME is executed.

On the other hand, if the predicted value MPS12 is "1", the A-register value 35A is updated to the LPS region width Qe14, the C-register value 30C is not updated, and the renormalization process RENORME is executed.

FIG. 36 is a flowchart of the detailed operation of the RENORME routine for the renormalization process. As shown in FIG. 36, the A-register value 35A is shifted to the left (SLL: Shift Left Logical) by 1.

If the C-register value 30C is negative, it means that the output flag is set at the most significant bit by the shifting operation and the arithmetic code 15 of 1 byte is ready to be output. In this case, after the C-register value 30C is shifted to the left by 1 bit, an outputting process BYTEOUT for outputting the arithmetic code 10 to the B-buffer is executed.

If the C-register value 30C is not negative, the outputting process BYTEOUT is not executed although the C-register value 30C is shifted to the left by 1 bit. In other words, the arithmetic code 15 of 1 byte is not ready to be output.

After the SLL operation of the C-register 30, the A-register value 30A is compared with the minimum effective region width Amin. If A<Amin, the SLL operations of the C-register value 30C and the A-register value 35A are repeated until the A register value 35A becomes larger than the minimum effective region width Amin. At the end of the renormalization process, the model probability generator 1 on the input side is instructed to update the LPS region width Qe14 to a new LPS region width Qe14 which corresponds to the next probability region.

FIG. 37 is a flowchart of the detailed operation of the BYTEOUT routine for outputting the arithmetic code 15. As shown in FIG. 37, if the buffer value B is the byte X'FF', a 7-bits outputting process SHIP7 is executed.

On the other hand, if the buffer value B is not the byte X'FF' and the C-register value 30C is not larger than X'FFFFFF', an 8-bits outputting process SHIP8 is executed. If the C-register value 30C is larger than X'FFFFFF', a carry is propagated to the B-buffer. The case in which the C-register value 30C is larger than X'FFFFFF' is a case in which a carry is propagated to the least significant bit (carry bit) of the Cf-register 34 through the Cs-register 32 and the Cb-register 33 by the addition of the LPS region width Qe14.

If the buffer value B becomes the byte X'FF' as a result of the propagation, the carry bit of the C register 30 (already propagated to the B-buffer) is cleared and the 7-bits outputting process SHIP7 is executed. On the other hand, if the buffer value B is not the byte X'FF', the 8-bits outputting process SHIP8 is executed.

FIG. 38 is a flowchart of the detailed operation of the routine SHIP8 for outputting 8 bits. As shown in FIG. 38, a buffer value updating process NEXTBYTE is first executed. Thereafter the value obtained by shifting the C-register value 30C to the right (SRL: Shift Right Logical) by 16 bits, namely, the portion of the Cb-register 33 (bits 16 to 23) is substituted into the buffer value B. The bits already output from the C-register 30 or the unnecessary bits (bits 16 to 31) therein are cleared from the C-register 30 (substituted by "1"). An output flag (bit 24) is set in advance (substituted by "1") so that the BYTEOUT routine is executed when the most significant bit (i,e., bit 15) of the remaining bits reaches the most significant bit (bit 23) of the Cb-register 33 by renormalization.

FIG. 39 is a flowchart of the detailed operation of the routine SHIP7 for outputting 7 bits. As shown in FIG. 39, the buffer value updating process NEXTBYTE is first executed. Thereafter the value obtained by shifting the C-register value 30C to the right (SRL: Shift Right Logical) by 17 bits, namely, the first 7 bits (bits 17 to 23) of the Cb-register 33 and the least significant bit (bit 24) of the Cf-register 34 is substituted into the buffer value B. The bit 24 is substituted into the buffer value B as a carry control signal 100. That is, the bit 24 is positioned at the position of the most significant bit of the byte immediately after the byte X'FF'. The bits already output from the C-register 30 or the unnecessary bits (bits 17 to 31) therein are cleared from the C-register 30 (substituted by "0"). An output flag (bit 25) is set in advance (substituted by "1") so that the BYTEOUT routine is executed when the most significant bit (i,e., bit 16) of the remaining bits reaches the most significant bit (bit 23) of the Cb-register 33 by renormalization.

FIG. 40 is a flowchart of the detailed operation of the routine NEXTBYTE for updating the buffer value B. As shown in FIG. 40, the buffer value B is updated by incrementing the buffer pointer BP. If the buffer pointer BP is not smaller than (i,e., equal to) the last address BE of the arithmetic code buffer, the arithmetic code 15 stored in the arithmetic code buffer is transmitted, and the buffer pointer BP is reset to the first address BPST of the arithmetic code buffer.

FIG. 41 is a flowchart of the detailed operation of the routine FLUSH as a postprocessing of the encoding operation. As shown in FIG. 41, the count value CT for postprocessing is set to "24", which is equal to the total number of bits (number of shifts) for sweeping out the Cx-register 31, the Cs-register 32 and the Cb-register 33. The count value CT for postprocessing is then decremented by 1. When the C-register value 30C is negative, that is, when an output flag "1" is situated at the most significant bit, the C-register value 30C is shifted to the left by 1 bit and thereafter a FINALBYTES routine for finally outputting the arithmetic code 15 is executed. On the other hand, if the C-register value 30C is positive, in other words, if the arithmetic code 15 of 1 byte is not ready to be output, the C-register value 30C is shifted to the left by 1 bit, the process returns to the count value CT decrementing process, and the above-described processings are repeated.

FIG. 42 is a flowchart of the detailed operation of the routine FINALBYTES for finally outputting the arithmetic code 15. As shown in FIG. 42, if the buffer value B is the byte X'FF', a 7-bits sweeping-out process FLUSH7 is executed. If the buffer value B is not the byte X'FF' and the C-register value 30C is not larger than X'FFFFFF', an 8-bits sweeping-out process FLUSH8 is executed.

If the buffer value B is not the byte X'FF' and the C-register value 30C is larger than X'FFFFFF', a carry is propagated to the B-buffer. The case in which the C-register value 30C is larger than X'FFFFFF' is a case in which a carry is propagated to the least significant bit (carry bit) of the Cf-register 34 through the Cs-register 32 and the Cb-register 33 by the addition of the LPS region width Qe14. If the buffer value B becomes the byte X'FF' as a result of the propagation, the carry bit is cleared (substituted by "0"), and the 7-bits sweeping-out process FLUSH7 is executed. On the other hand, if the buffer value B is not the byte X'FF', the 8-bits sweeping-out process FLUSH8 is executed.

In this manner, either the 7-bits sweeping-out process FLUSH7 or the 8-bits sweeping-out process FLUSH8 is executed.

If the count value CT for postprocessing is positive after the 8-bits sweeping-out process FLUSH8 or the 7-bits sweeping-out process FLUSH7 is executed, the above-described process is repeated from the judgment as to whether or not the buffer value B is the byte X'FF'. On the other hand, if the count value CT for postprocessing is not positive, the buffer pointer BP is incremented by 1.

If the arithmetic code 15 is not finished on the byte boundary, dummy bits "0"s are inserted to the last code byte until the byte boundary. The stored arithmetic code 15 of BP-BPST bytes is transmitted from the first address BPST of the arithmetic code buffer to an external equipment, thereby finishing the encoding process.

FIG. 43 is a flowchart of the detailed operation of the routine FLUSH8 as the 8-bits sweeping-out process. As shown in FIG. 43, the buffer value updating process NEXTBYTE is first executed. Thereafter the value obtained by shifting the C-register value 30C to the right by 16 bits, namely, the portion of the Cb-register 33 (bits 16 to 23) is substituted into the buffer value B. The bits already output from the C-register 30 or unnecessary bits (bits 16 to 31) therein are cleared from the C-register 30 (substituted by "0"). The C-register value 30C is shifted to the left by 8 bits so that the most significant bit (bit 15) of the remaining bits reaches the most significant bit (bit 23) of the Cb-register 33. Simultaneously, 8 is subtracted from the count value CT for postprocessing.

FIG. 44 is a flowchart of the detailed operation of the routine FLUSH7 as the 7-bits sweeping-out process. As shown in FIG. 44, the buffer value updating process NEXTBYTE is first executed. Thereafter the value obtained by shifting the C-register value 30C to the right by 17 bits, namely, the first 7 bits (bits 17 to 23) of the Cb-register 33 and the least significant bit (bit 24) of the Cf-register 34 is substituted into the buffer value B. The bit 24 is substituted into the buffer value B as the carry control signal 100 and positioned at the most significant bit of the byte immediately after the byte X'FF'. The bits already output of the C-register 30 or the unnecessary bits (bits 17 to 31) therein are cleared from the C-register 30 (substituted by "0"). The C-register value 30C is shifted to the left by 7 bits so that the most significant bit (bit 16) of the remaining bits reaches the most significant bit (bit 23) of the Cb-register 33. Simultaneously, 7 is subtracted from the count value CT for postprocessing.

The arithmetic decoder 3 of an every-time 1-bit insertion system executes the decoding operation by an arithmetic decoding means 6 in accordance with the flowchart shown in FIG. 30. The symbol INITDEC represents a routine for initialization at the start of the decoding process. The acquisition of MPS and Qe is realized by receiving the two parameters (the predicted value MPS17 and the LPS region width Qe19) from the model probability generator 4 on the output side. The symbol DECODE represents a routine for actually decoding the arithmetic code 15 by using the received parameters and outputting an output parameter (output value YN16). The acquisition of MPS and Qe and the routine DECODE are repeated until the end of the input and output of the parameters.

A C-register 50 of the arithmetic decoder 3 of an every-time 1-bit insertion system is composed of a register of 32 bits, as shown in FIG. 45. In the C-register 50, the fixed point is provided between bit 27 and bit 28. The C-register 50 is divided into a Cf-register 51 of bit 0 to bit 7, a Cn-register 52 of bit 8 to bit 15, and a Cx-register 53 of bit 16 to bit 27 (bit 31).

The LPS region width Qe19 is a register having the same accuracy (same bits) as the Cx-register 53, and the value of the LPS width Qe19 is subtracted from the Cx-register 53. The arithmetic code 15 read out of the arithmetic code buffer is stored in one of the bits 9 to 16 of the Cn-register 52 or the C-register 50. The Cf-register 51 is used for the purpose of indicating the input timing from the arithmetic code buffer. If an input flag "1" is set in the Cf-register 51 and the bit "1" is shifted to the least significant bit of the Cn-register 52, it indicates that it is necessary to input the arithmetic code 15 of the next 1 byte. An A-register 54 is composed of a register of 16 bits, as shown in FIG. 45, and the fixed point is provided at the same position as in the Cx-register 53. Arithmetic operation is carried out between the value of the A-register 54 and the LPS region width Qe19.

The decoding operation by the arithmetic decoding means 6 of an every-time 1-bit insertion system will be explained with reference to the following flowcharts. The variables and constants used in the flowcharts are as follows:

| | |
|---|---|
| C | C-register value (decoding register) 50 |
| Cf | Cf-register value (bits 0 to 7) 51 |
| Cn | Cn-register value (bits 8 to 15) 52 |
| Cx | Cx-register value (bits 16 to 31) 53 |
| A | A-register value (effective region width) 54 |
| YN | output value 16 |
| MPS | predicted value 17 |
| LPS | complementary predicted value |
| Qe | LPS region width 19 |
| B | buffer value (byte indicated by a buffer pointer) |
| BP | buffer pointer (indicating the location in the arithmetic code buffer where the arithmetic code is stored) |
| Amin | minimum value of the effective region width (as a renormalization condition) |
| BPST | first address of the arithmetic code buffer |
| LEN | buffer capacity (unit: byte) |
| BE | last address of the arithmetic code buffer |

FIG. 46 is a flowchart of the detailed operation of the INITDEC routine for initialization at the start of the decoding process. As shown in FIG. 46, tables are set up and a storage unit is initialized first. The arithmetic code buffer is secured and set up in the memory. The buffer pointer BP indicates the first address BPST of the arithmetic code buffer and utilized for storing the arithmetic code 15 in the arithmetic code buffer. The minimum effective region width Amin is set in the A-register 54 as the initial value. The minimum effective region width Amin is not changed and treated as a constant during the encoding operation. In preparation for substituting the arithmetic code 15 into the Cn-register value 53Cn, the buffer value B is first shifted to the left by 16 bits. A BYTEIN process for inputting the arithmetic code 15 is then executed and the arithmetic code 15 is read by the Cn-register 52. By shifting the C-register value 50C to the left by 4 bits, the Cx-register 53 (12 bits) is initialized. That is, the arithmetic code 15 being decoded is set in the Cx-register 53.

FIG. 47 is a flowchart of the detailed operation of the DECODE routine for actually processing the decoding operation. As shown in FIG. 47, the Cx-register value 53Cx is first compared with the LPS region width Qe19 obtained from the model probability generator 4 on the output side. If the Cx-register value 53Cx is larger than the LPS region width Qe19, the predicted value MPS17 is decoded and output as the output value YN16. Both the C-register value 50C and the A register value 54A are updated by subtracting the LPS region width Qe19 from the respective values. If the updated A-register value 54A is smaller than the minimum effective region width Amin, a renormalization process RENORMD is carried out.

On the other hand, if the Cx-register value 53Cx is less than the LPS region width Qe19, the complementary predicted value LPS is decoded and output as the output value YN16. The A-register value 54A is updated by substituting the LPS region width Qe19 into the A-register value 54A, the C-register value 50C is not updated, and the renormalization process RENORMD is executed.

The detailed operation of the RENORMD routine for the renormalization in the decoding process is shown in the flowchart in FIG. 48. As shown in FIG. 48, only when the input flag of the C-register 51 is shifted to the least significant bit of the Cn-register value 52Cn and the value Cf of the Cf-register 51 becomes a byte X'00', a BYTEIN process for inputting the arithmetic code 15 is executed.

Whether the value Cf of the Cf-register 51 becomes the byte X'00' or not, both the C-register value 50C and the A-register value 54A are shifted to the left by 1 bit. When the A-register value 54A is smaller than the minimum effective region width Amin, the same process is repeated from the judgment as to whether or not the Cf-register value 51Cf is the byte X'00'. In this way, the renormalization RENORMD is executed. When the renormalization RENORMD is finished, the LPS region width Qe19 output from the model probability generator 4 on the output side is updated to a new LPS region width Qe19 which is to be adopted at the next probability region.

FIG. 49 is a flowchart of the detailed operation of the BYTEIN routine for inputting the arithmetic code 15. As shown in FIG. 49, judgment is first made as to whether or not the buffer value B is the byte X'FF'.

If the buffer value B is the byte X'FF', a buffer value updating process GETBYTE is executed. The updated buffer value B includes the carry control signal 100 at the most significant bit. In order to input the arithmetic code 15 of 1 byte after a 7-bits shift (so as to remove the carry control signal 100) in the renormalization routine, an input flag "1" is set at the bit 1 of the Cf-register value 51Cf. The Cn-register 52 is cleared (substituted by "0"). By adding the value obtained by shifting the buffer value B to the left by 9 bits to the C-register value 50C, the arithmetic code 15 is input. The carry control signal 100 at the most significant bit of the buffer value B is added to the least significant bit (bit 16) of the Cx-register value 53Cx. It is therefore possible to propagate the carry accurately which has been absorbed by the control signal 100.

On the other hand, if the buffer value B is not the byte X'FF', after the buffer value updating process GETBYTE is executed, the following operation is carried out. In order to input the arithmetic code 15 of 1 byte after an 8-bits shift in the renormalization routine, an input flag "1" is set at the bit 0 of the Cf-register value 51Cf. The buffer value B is substituted as it is into the Cn-register value 52Cn.

FIG. 50 is a flowchart of the detailed operation of the routine GETBYTE for updating the buffer value B in the decoding process. As shown in FIG. 50, the buffer value B is first updated by incrementing the buffer pointer BP. If the buffer pointer BP is not smaller than (i,e, equal to ) the last address BE of the arithmetic code buffer, the arithmetic code 15 is received by the arithmetic code buffer, and the buffer pointer BP is reset to the first address BPST of the arithmetic code buffer.

The model probability generator 4 on the output side outputs the predicted value MPS17 of the occurrence probability of the output value YN16 and the region width Qe19 of the complementary LPS to the arithmetic decoder 3, receives the decoded output value YN16 as the input, and outputs the output data 20. When the renormalization routine RENORMD is carried out by the arithmetic decoder 3, the probability region of the complementary predicted value LPS is changed and the LPS region width Qe19 is updated.

The code transmitting apparatus shown in Example 1 adopts a transmission control system in which one carry propagation absorbing control bit is inserted in the code bit stream at intervals of a 1's run having at least a predetermined length (every-time 1-bit insertion system). Therefore, the number of bits inserted and, hence, the total length of the transmitted code increases in proportion to the 1's run length.

The code transmitting apparatus shown in Example 2 adopts a transmission control system in which a carry control signal of 1 bit (or more) is inserted into an arithmetic code every time the byte X'FF' occurs therein (every-time 1-bit insertion system). Therefore, the number of bits inserted and, hence, the total length of the transmitted arithmetic code increases in proportion to the frequency at which the byte X'FF' occurs.

SUMMARY OF THE INVENTION

Accordingly, it is an object of the present invention to eliminate the above-described problems in the related art and to provide a transmission control system in which only one insertion of two carry propagation absorbing control bits at every 1's run (one-time 2-bits insertion system) in a code transmitting apparatus is sufficient.

To achieve this aim, in a first aspect of the present invention there is provided a code transmitting apparatus of a one-time 2-bits insertion system comprising the following means.

An arithmetic encoding means for dividing an effective region width A (a binary fraction which is stored in a region register) on a probability number line into the region width A(0) of a more probable symbol (MPS) and the region width A(1) of an less probable symbol (LPS) in accordance with the occurrence probability ratio whenever a symbol of a symbol stream which is supplied from an information source as an object of encoding is encoded.

When the symbol is a more probable symbol (MPS), the current lower boundary value CR of the effective region width A (a binary fraction which is stored in a region register) is updated to the value obtained by adding A(1) thereto, and A is updated to A(0). On the other hand, when the symbol is an less probable symbol (LPS), the current lower boundary value CR is maintained as it is, and A is updated to A(1). This dividing and allotting process is repeated until the final bit of the symbol stream which is the object of encoding, and an encoded signal and a carry signal are serially supplied.

A carry transmission control means of a one-time 2-bits insertion system monitors the encoded signal and the carry signal serially supplied from the arithmetic encoding means, inserts two carry propagation absorbing control bits composed of a first bit "0" which indicates the end of a 1's run and a second bit "1" which indicates the presence or absence of a carry from the adjacent digit immediately after the end of a 1's run having at least a predetermined length, and supplies a code bit stream with the carry propagation absorbing control bits inserted therein to a transmission path.

A carry reception control means of a one-time 2-bits insertion system monitors the code bit stream supplied from the transmission path and detects the two carry propagation absorbing control bits "00" or "01" immediately after the end of a 1's run having at least a predetermined length. The carry reception control means supplies a decoded signal and a control bit detection signal in accordance with the carry propagation absorbing control bits.

An arithmetic decoding means divides A into A(0) and A(1) in the same process as by the arithmetic encoding means whenever the encoded symbol stream is decoded into the corresponding symbol. When the first plural digits DR (i.e., binary fraction stored in a decoding register) at the left of the decoding bit supplied from the carry reception control means is not smaller than A(1), the code is decoded into a more probable symbol (MPS), DR is updated to the value with A(1) subtracted therefrom, and A is updated to A(0). On the other hand, when DR is smaller than A(1), the code is decoded into an less probable symbol (LPS), DR is maintained at the current value, and A is updated to A(1).

This dividing and allotting process is repeated until the final bit of the encoded symbol stream which is the object of decoding, and a decoded symbol stream is generated. Simultaneously, a carry is propagated by the control bit detection signal from the carry reception control means.

The code transmitting apparatus arithmetically encodes the symbol stream which is supplied from an information source as an object of encoding by the above-described means. The two carry propagation absorbing control bits are inserted once only at the end of a 1's run having at least a predetermined length in the code bit stream. By monitoring the received codes, the presence or absence of a carry from the adjacent digit is detected. The decoded symbol stream is generated by arithmetic decoding and a carry is propagated in accordance with the presence or absence of a carry.

In a second or a third aspect of the present invention, there is provided a code transmission system adopting a transmission system in which a carry is absorbed so as to prevent from being propagated by inserting, for example, bits "00" (when the carry control signal absorbs a carry, the bit becomes "01") as a carry control signal into the first 2 bits of the byte other than a byte X'FF' subsequent to at least a predetermined number (4 bytes=32 bits in the later-described embodiments of the present invention) of consecutive bytes X'FF' s in an arithmetic code. This system is called a one-time 2-bits insertion system.

A code transmission system provided in the second aspect of the present invention has the following structure:

(a) an encoding means for encoding information;
(b) a transmitting means for transmitting a code by a predetermined transmission unit; and
(c) a control signal adding means for adding a control signal which controls a code having a predetermined pattern to the predetermined pattern after the end of the continuation of the predetermined patterns when the contents of the transmission unit are consecutively transmitted in the predetermined pattern.

A code transmission system provided in the third aspect of the present invention has the following structure:

(a) an encoding means for encoding information;
(b) a detecting means for detecting consecutive predetermined patterns and the end thereof from a code generated by the encoding means;
(c) an adding means for adding a control signal which controls a change in the predetermined pattern to the code when the end of the continuation of the predetermined patterns is detected by the detecting means; and
(d) an outputting means for outputting the code generated by the encoding means and the control signal added thereto by the adding means.

A code transmission system provided in the second or third aspect of the present invention arithmetically encodes the data input from the information source and transmits the encoded signal according to the above-described structure. Whenever at least a predetermined number of consecutive bytes X'FF' occur in the arithmetic code, the carry control signal is inserted only once into the first 2 bits of the byte other than the byte X'FF' subsequent to the consecutive bytes. Therefore, it is possible to detect the presence or absence of a carry from the adjacent digit by the carry control signal in the transmitted arithmetic code, and if there is a carry, it is propagated and the code is arithmetically decoded, thereby generating output data.

The above and other objects, features and advantages of the present invention will become clear from the following description of the preferred embodiments thereof, taken in conjunction with the accompanying drawings.

BRIEF DESCRIPTION OF THE DRAWINGS

FIG. 23 is an explanatory view of the number of bits inserted by a code insertion system according to the present invention as compared with that in a conventional code insertion system;

DESCRIPTION OF THE PREFERRED EMBODIMENTS

Preferred embodiments of the present invention will be explained hereinunder with reference to the accompanying drawings.

First Embodiment

Figure 1:
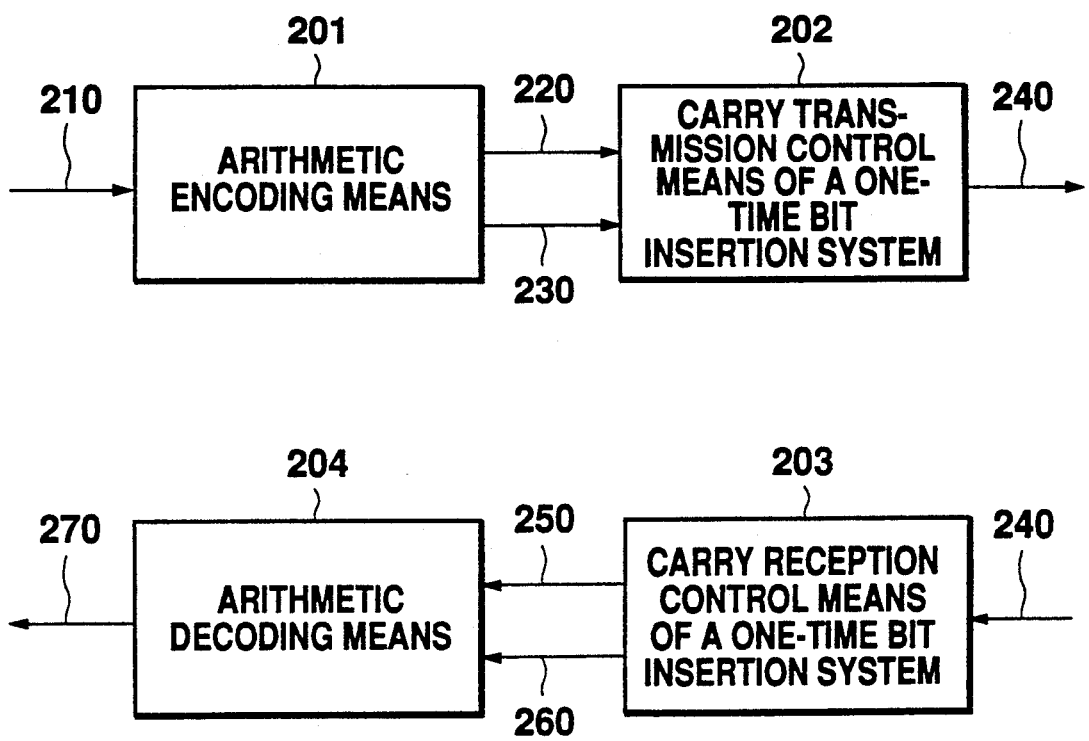
FIG. 1 is a block diagram of the function of a first embodiment of a code transmitting apparatus according to the present invention.
Figure 24:
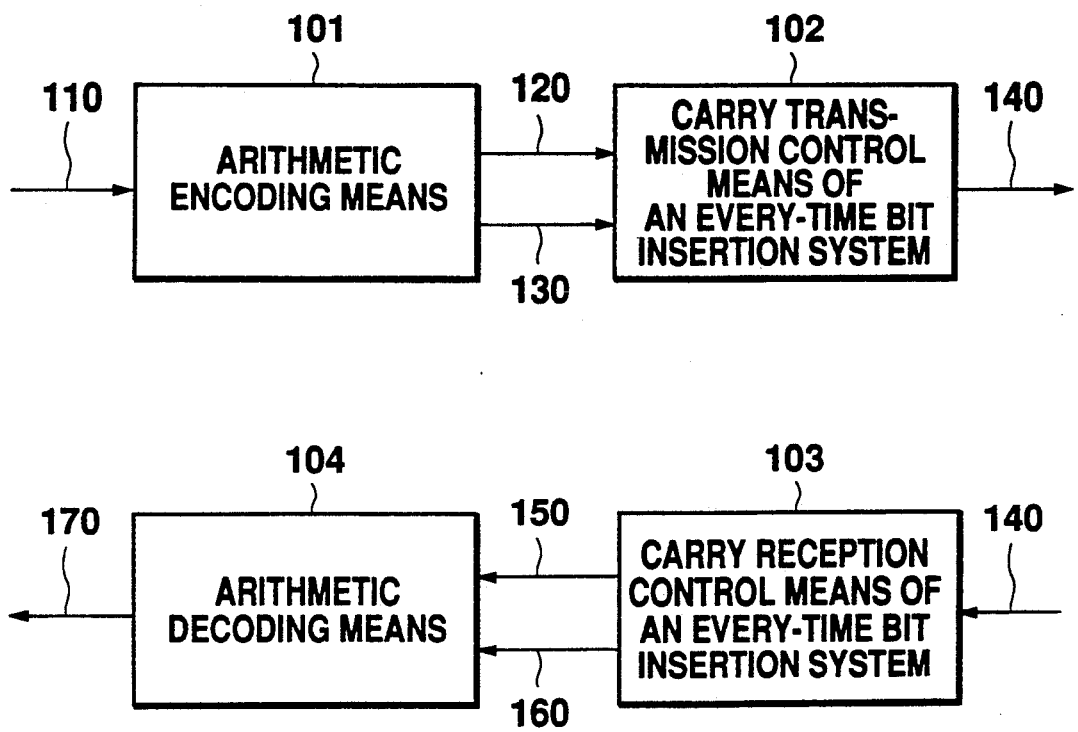
FIG. 24 is a block diagram of the function of a conventional code transmitting apparatus.
Figure 25:
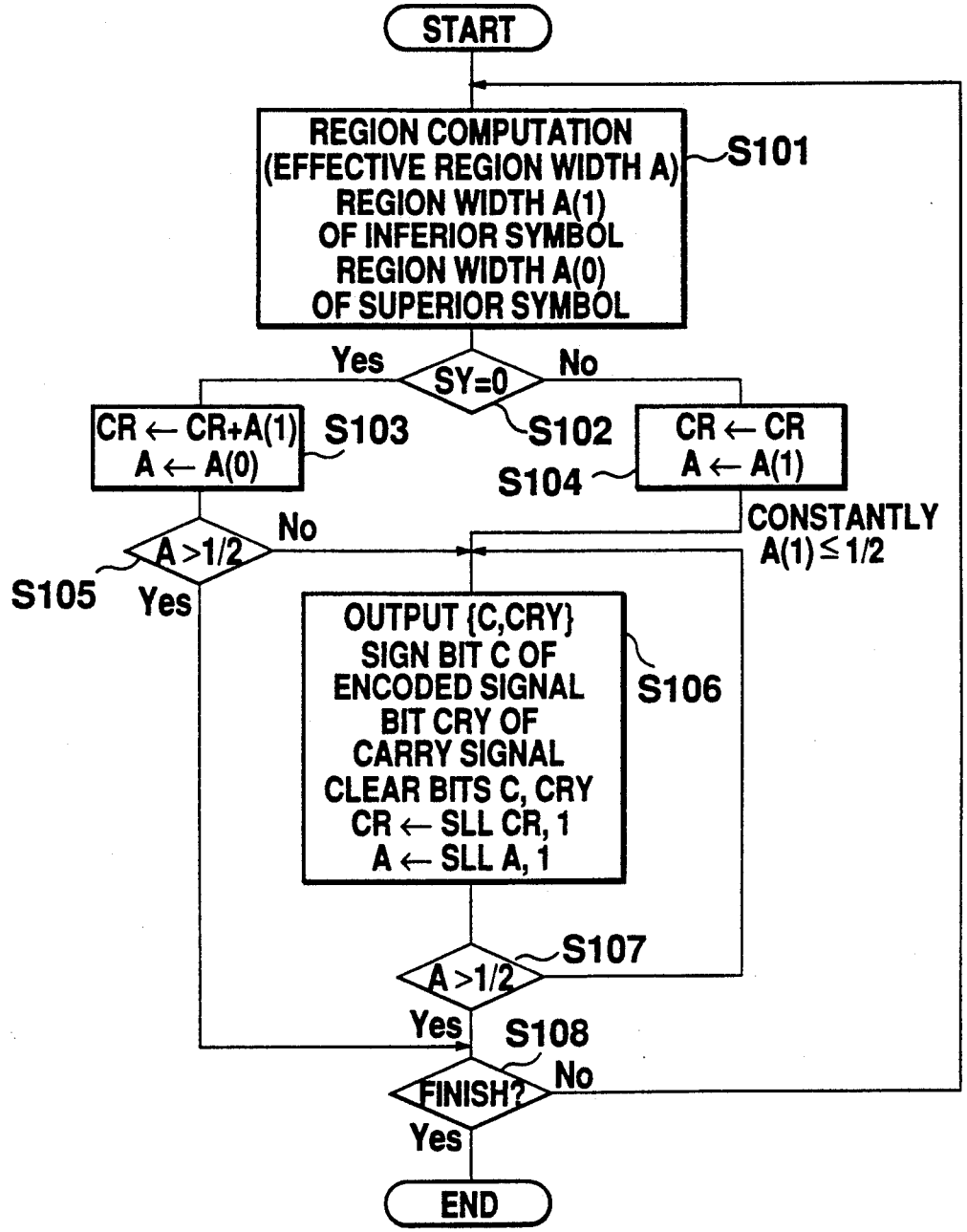
FIG. 25 is a flowchart of the arithmetic encoding means shown in FIG. 24.
Figure 26:
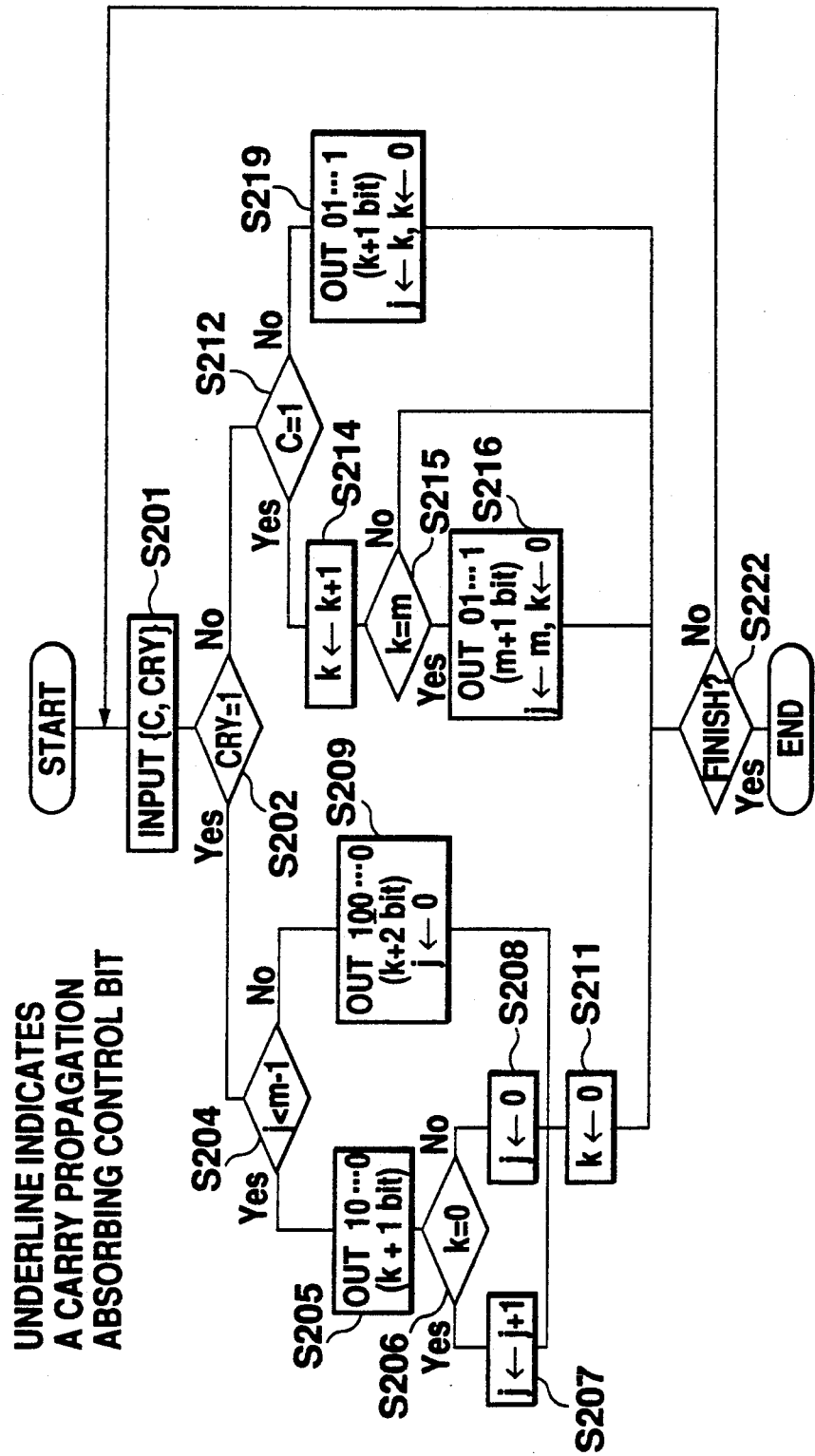
FIG. 26 is a flowchart of the processing of the carry transmission control means of an every-time 1-bit insertion system shown in FIG. 24.
Figure 27:
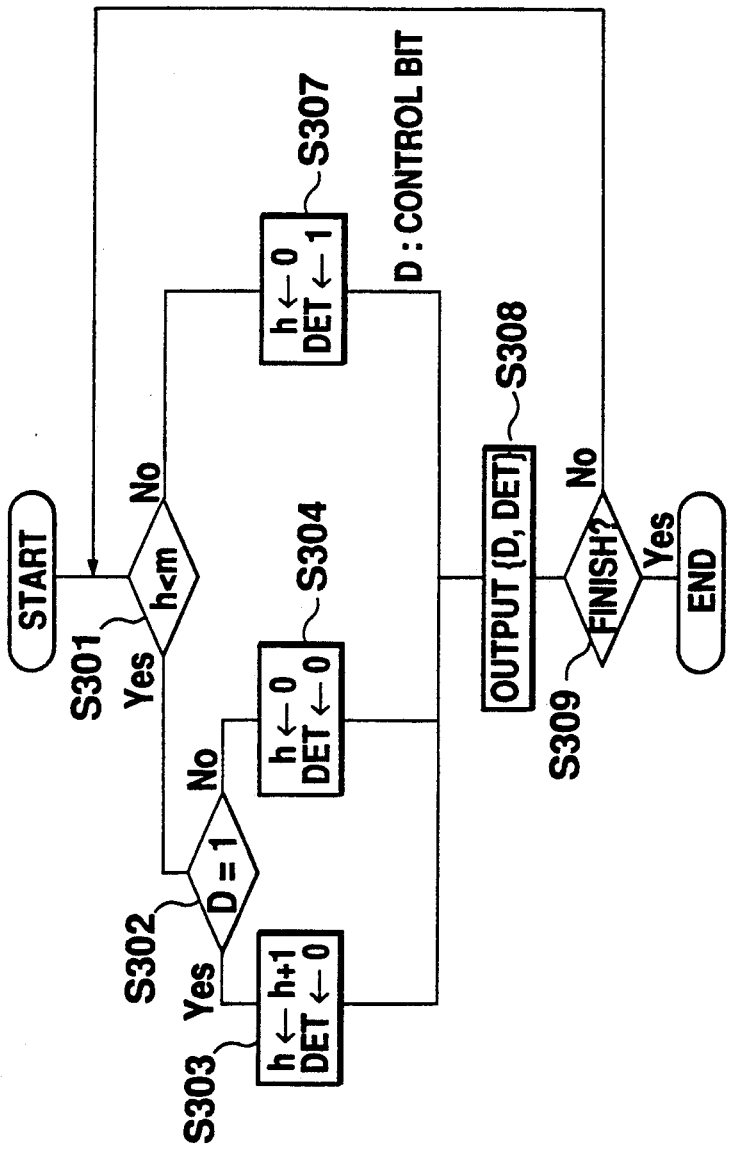
FIG. 27 is a flowchart of the processing of the carry reception control means of an every-time 1-bit insertion system shown in FIG. 24.
Figure 28:
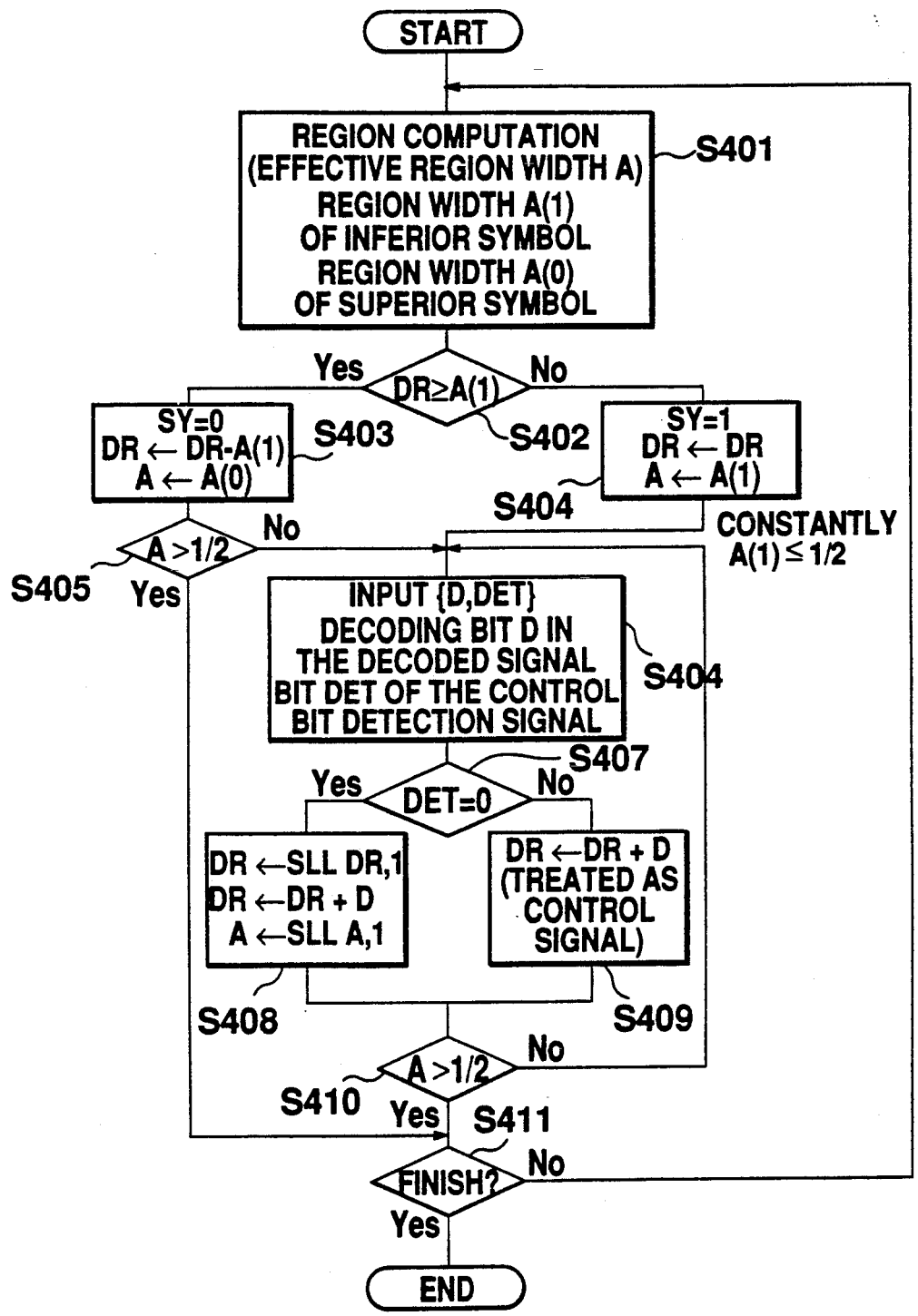
FIG. 28 is a flowchart of the arithmetic decoding means shown in FIG. 24.

FIG. 1 shows a first embodiment of a code transmitting apparatus according to the present invention. An arithmetic encoding means 201 and an arithmetic decoding means 204 shown in FIG. 1 correspond to the conventional arithmetic encoding means 101 and the arithmetic decoding means 104, respectively, shown in FIG. 24 and have the same structure.

A carry transmission control means 202 of a one-time 2-bits insertion system monitors an encoded signal 201 and a carry signal 230 which are output from the arithmetic encoding means 201, limits the carries to be propagated from the adjacent digit to a predetermined number by a one-time 2-bits insertion system of the present invention, and outputs the resulting code bit stream 240 to a transmission path.

A carry reception control means 203 of a one-time 2-bits insertion system receives the code bit stream 240 from the transmission path. By monitoring the code bit stream 240, the carry reception control means 203 detects the presence or absence of a carry from the adjacent digit, and outputs a decoded signal 250 and a control bit detection signal 260.

In the code transmitting apparatus of this embodiment, two carry propagation absorbing control bits are inserted only once in the code bit stream 240 after the end of a 1's run having at least a predetermined length (predetermined number of consecutive code bits "1"s). This transmission control system is called a "one-time 2-bits insertion system" in this specification.

Figure 2:
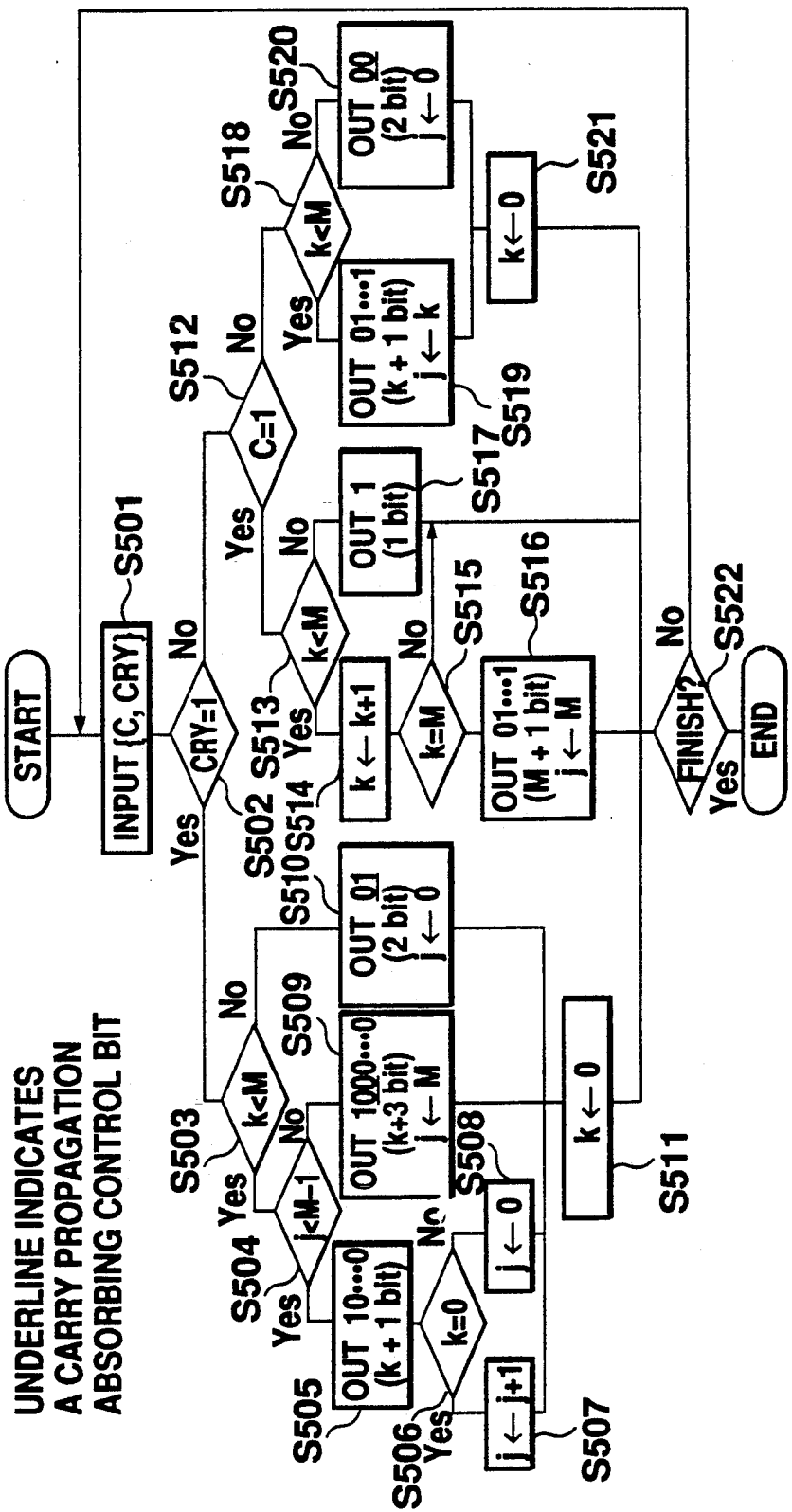
FIG. 2 is a flowchart of the processing of the carry transmission control means of a one-time 2-bits insertion system shown in FIG. 1.

FIG. 2 is a flowchart of the operation of the carry transmission control means 202 of the one-time 2-bits insertion system. As shown in FIG. 2, the code bit C of the encoded signal 220 and the bit CRY of the carry signal 230 are first monitored to detect the presence or absence of a carry from the adjacent digit (steps S501 and S502). Simultaneously, a 1's run length j which has been transmitted to the transmission path and a 1's run length k in the encoded signal 220 which is waiting for the command for transmission in the transmission control means 202 are counted.

At step S502, if CRY ="1", that is, if there is a carry, the process proceeds to step S503. If it is assumed that the maximum admissible number of carries to be propagated is M, judgment is made as to whether or not k<M at step S503. If k<M, the process proceeds to step S504, wherein judgment is made as to whether or not j<M−1. If j<M−1, a carry inversion bit pattern "10 . . . 0" of k+1) bits is supplied to the transmission path (S505). Thereafter whether or not k=0 is judged at step S506. If k=0, 1 is added to j at step S507, while if k≠0, j is reset (substituted by "0") at step S508. Thus, the "1" run at a code bit of "0" is finished.

If j=M at the step S504, a carry inversion bit pattern "1000 . . . 0" of (k+3) bits is transmitted to the transmission path (step S509). In this inversion bit pattern, j becomes equal to M due to the first bit "1". Therefore, carry propagation absorbing control bits "00" is inserted immediately after the first bit "1". At step S509, j is reset (substituted by "0").

If k=M (if the 1's run length k is not smaller than M, it is assumed that k=M) at the step S505, carry propagation absorbing control bits "01" are supplied to the transmission path immediately after the end of one 1's run (step S510) and j is reset (substituted by "0") in the same way as at the step S509.

As described above, CRY="1" at the step S502, in other words, if the processings from the steps S503 to S510 are finished, k is reset (substituted by "0") at step S511 and the current C (="0") becomes the first bit of the next waiting bit pattern "01 . . . 1".

On the other hand, if there is no carry at the step S502, namely, when CRY="0", the process proceeds to step S512. At the step S512, judgment is made as to whether or not C=1. If C=1, the process proceeds to step S513. At the step S513, judgment is made as to whether or not k<M. If k<M, the process proceeds to step S514.

At the step S514, 1 is added to k, and if k=M at step S515, a no-carry inversion bit pattern "01 . . . 1" of (M+1) bits is transmitted to the transmission path and M is substituted into j (S516). On the other hand, if k≠M after 1 is added to k, the no-carry inversion bit pattern is left waiting. If k+M without adding 1 to k, in other words, if the relationship k<M is not satisfied at the step S513, the current C="1" is transmitted as it is to the transmission path.

If C="0" at the step S512, the process proceeds to step S518. At the step 518, judgment is made as to whether or not k<M. If k<M, the process proceeds to step S519. At the step 519, a no-carry inversion bit pattern "01 . . . 1" of (k+1) bits is transmitted to the transmission path and k is substituted into j. On the other hand if k=M at the step S518, the process proceeds to step S520. At the step S520, the two carry propagation absorbing control bits "00" are transmitted to the transmission path immediately after the end of one 1's run (step S510), and j is reset (substituted by "0").

The process proceeds from the step S519 or S520 to step S521, wherein k is reset (substituted by "0"). In this way, it is possible to regard the current C="0" as the first bit of the next waiting bit pattern "01 . . 1" (steps S518 to 521).

These processings shown in FIG. 2 are repeated until the last bit of the encoded signal 220 supplied from the arithmetic encoding means 201 (step S521).

Figure 3:
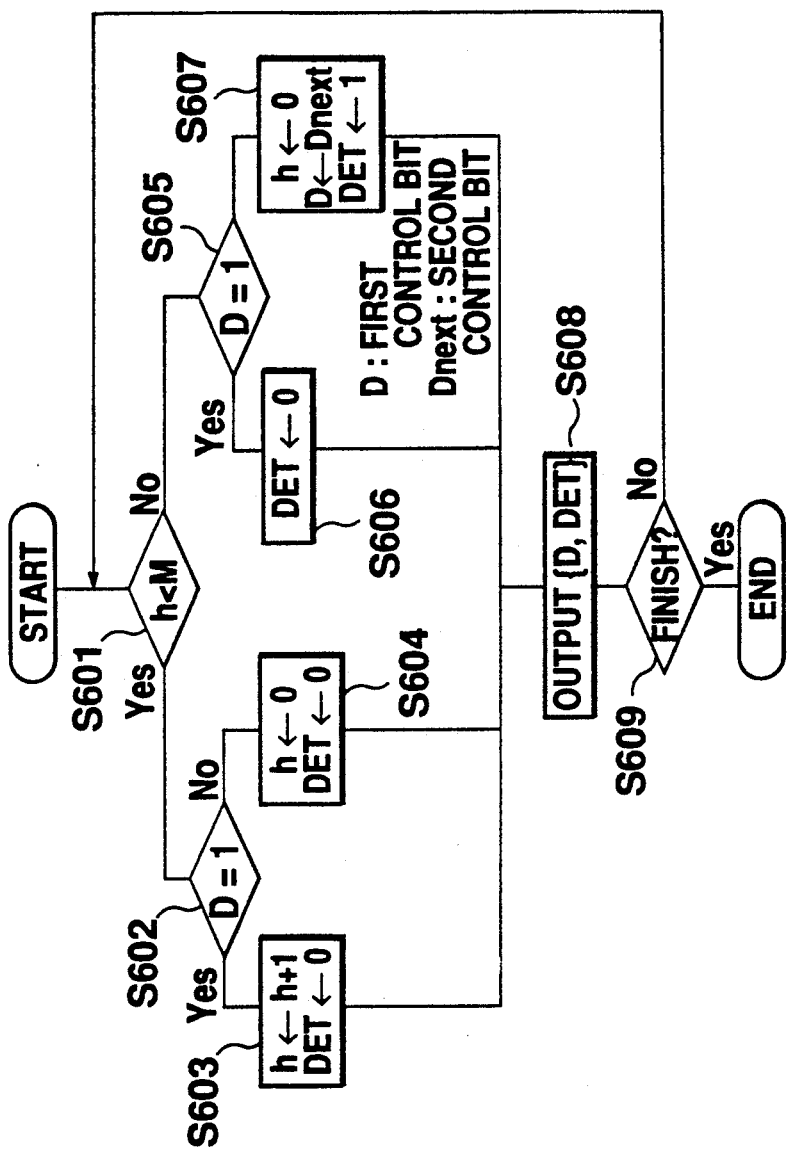
FIG. 3 is a flowchart of the processing of the carry reception control means of a one-time 2-bits insertion system shown in FIG. 1.

FIG. 3 is a flowchart of the operation of the carry reception control means 203 of a one-time 2-bits insertion system. As shown in FIG. 3, the received bit D of the code bit stream 240 is first monitored and a 1's run length h of the code bit list 240 is counted. The 1's run length h is compared with M at step 601. If h<M, judgment is made as to whether or not D=1 at step S602. If D="1", the process proceeds to step S603.

At the step S603, 1 is added to h, and "0" is substituted into the bit DET of the control bit detection signal 260. On the other hand, if D="0" at the step S602, the process proceeds to step S604. At the step S604, "0" is substituted into both h and the bit DET of the control bit detection signal 260.

If h=M (it is only when h=M that the 1's run length h is not smaller than M) at the step S601, judgment is made as to whether or not D="1" at step S605. If D="1", the process proceeds to step S606. If D="0", the process proceeds to step S607.

At the step S606, "0" is substituted into DET.

At the step S607, h is reset to "0" and the next bit Dnext is substituted into D. "1" is substituted into DET. At the step S607, the current C="0" and the next bit Dnext are regarded as the carry propagation absorbing control bits "00" or "01", so that D is updated to Dnext (D="0" is cancelled) and "1" is substituted into DET.

After the processings at the steps S603, S604, S606 and S607, the decoded signal 250 containing D as the decoding bit and the control bit detection signal 260 containing DET as a constituting bit are output at step S608. These processings are repeated until the last bit of the code bit stream 240 supplied from the transmission path (step 609).

In this embodiment, even if both the 1's run length k and the 1's run length h are larger than M, it is possible to insert carry propagation absorbing control bits irrespective of the values of k and h so long as the countable number is M. For example, if M is set to 2 m, the structure of this embodiment can be realized merely by increasing the counter width by 1 bit in the above-described conventional code transmitting apparatuses.

Second Embodiment

Figure 4:
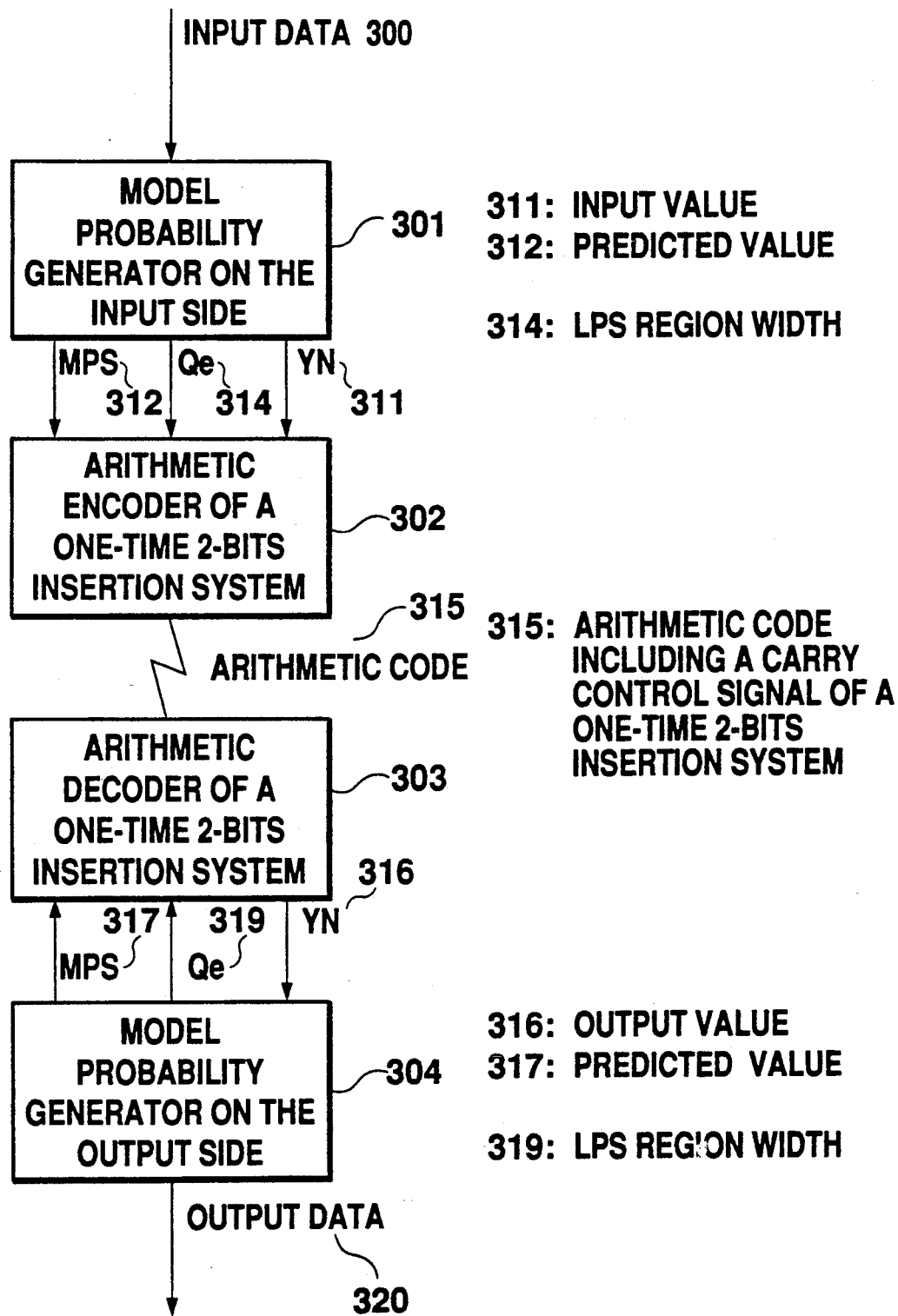
FIG. 4 is a block diagram of the function of a second embodiment of a code transmitting apparatus according to the present invention.
Figure 29:
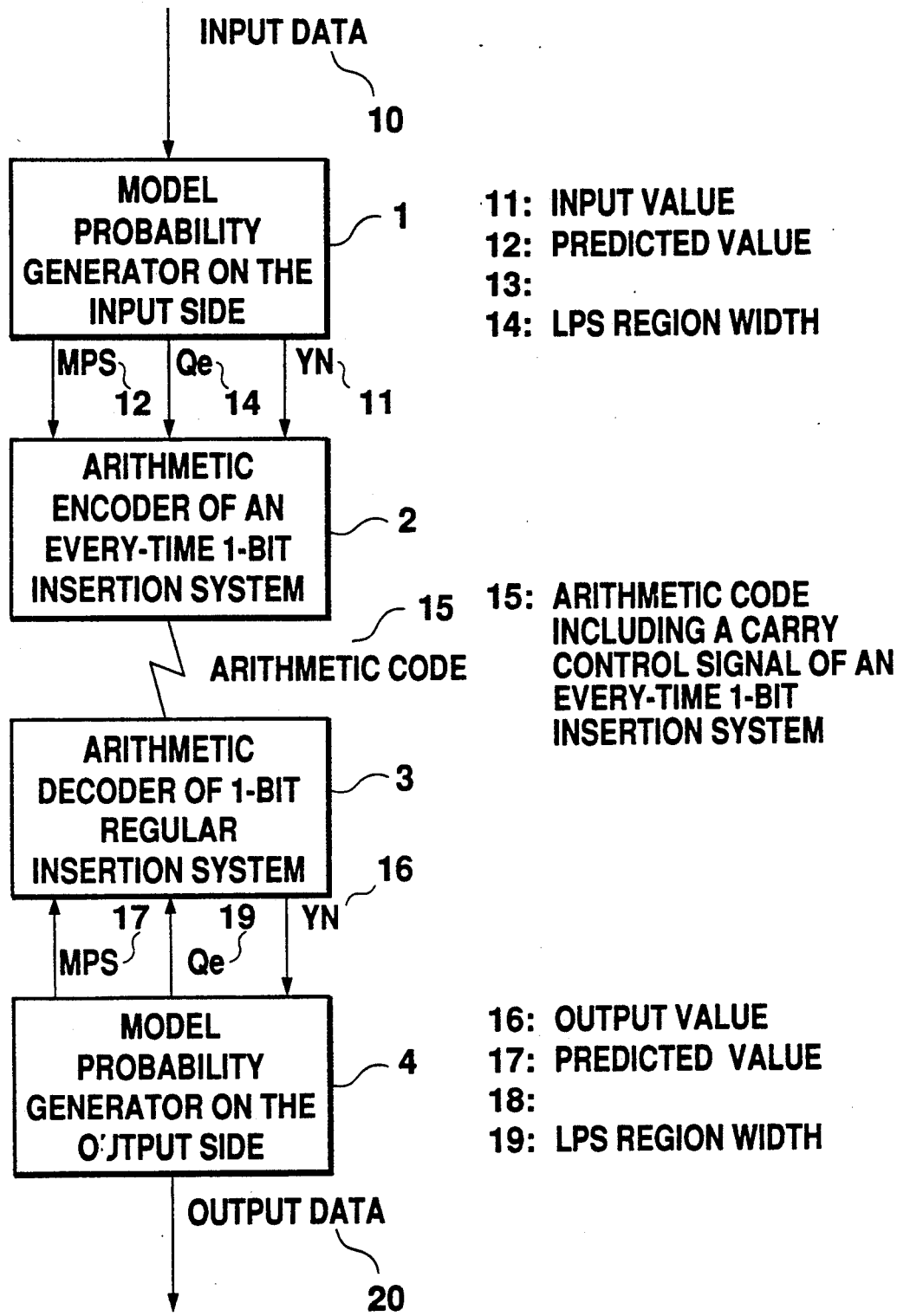
FIG. 29 is a block diagram of the function of another conventional code transmitting apparatus.

A control signal is inserted when a 1's run is finished in the first embodiment. In a second embodiment, a control signal is inserted on the boundary of byte units. The second embodiment is a preferred embodiment of a code transmission system provided in the second and third aspects of the present invention. FIG. 4 is a block diagram of the structure of a code transmitting apparatus in this embodiment. As shown in FIG. 4, a model probability generator 301 on the input side and a model probability generator 304 on the output side correspond to the model probability generator 1 on the input side and a model probability generator 4 on the output side, respectively, of a conventional code transmitting apparatus shown in FIG. 29. The control system in this embodiment is called a "one-time 2-bits insertion system" in this specification. An arithmetic encoder 302 of a one-time 2-bits insertion system generates an arithmetic code 315 by using an input signal YN311, a predicted value MPS 312 and an LPS region width Qe314 which are supplied from the model probability generator 301 on the input side. A one-time 2-bits insertion system is a system for inserting a carry control signal indicating the presence or absence of a carry from the adjacent digit into the first 2 bits of a byte other than X'FF' which occurs immediately after at least a predetermined number of consecutive bytes X'FF's in the arithmetic code 15 whenever at least the predetermined number of consecutive bytes X'FF's occurs in the arithmetic code 315. An arithmetic decoder 303 of a one-time 2-bits insertion system detects and processes the carry control signal by using the arithmetic code 315 supplied from the arithmetic encoder 302 of the one-time 2-bits insertion system and a predicted value MPS317 of the occurrence probability of an output value YN316 to be decoded and an LPS region width Qe319. The arithmetic decoder 303 of a one-time 2-bits insertion system arithmetically decodes the arithmetic code 315 fetched as the result of the processing, and outputs the output value YN316.

The code transmitting apparatus of this embodiment inserts bits "00" as a carry control signal into the first bits of a byte other than X'FF' which occurs immediately after the occurrence of at least a predetermined number of consecutive bytes X'FF's in the arithmetic code 15 whenever at least the predetermined number of consecutive bytes X'FF's occurs in the arithmetic code 315 being transmitted. As a result, the bits "00" (carry control signal) absorb a carry from the adjacent digit during arithmetic operation so as to prevent it from being propagated. This transmission control system (one-time 2-bits insertion system) is adopted by the code transmitting apparatus of this embodiment. When the carry control signal absorbs the carry, the bits "00" changes to bits "01".

Figure 5:
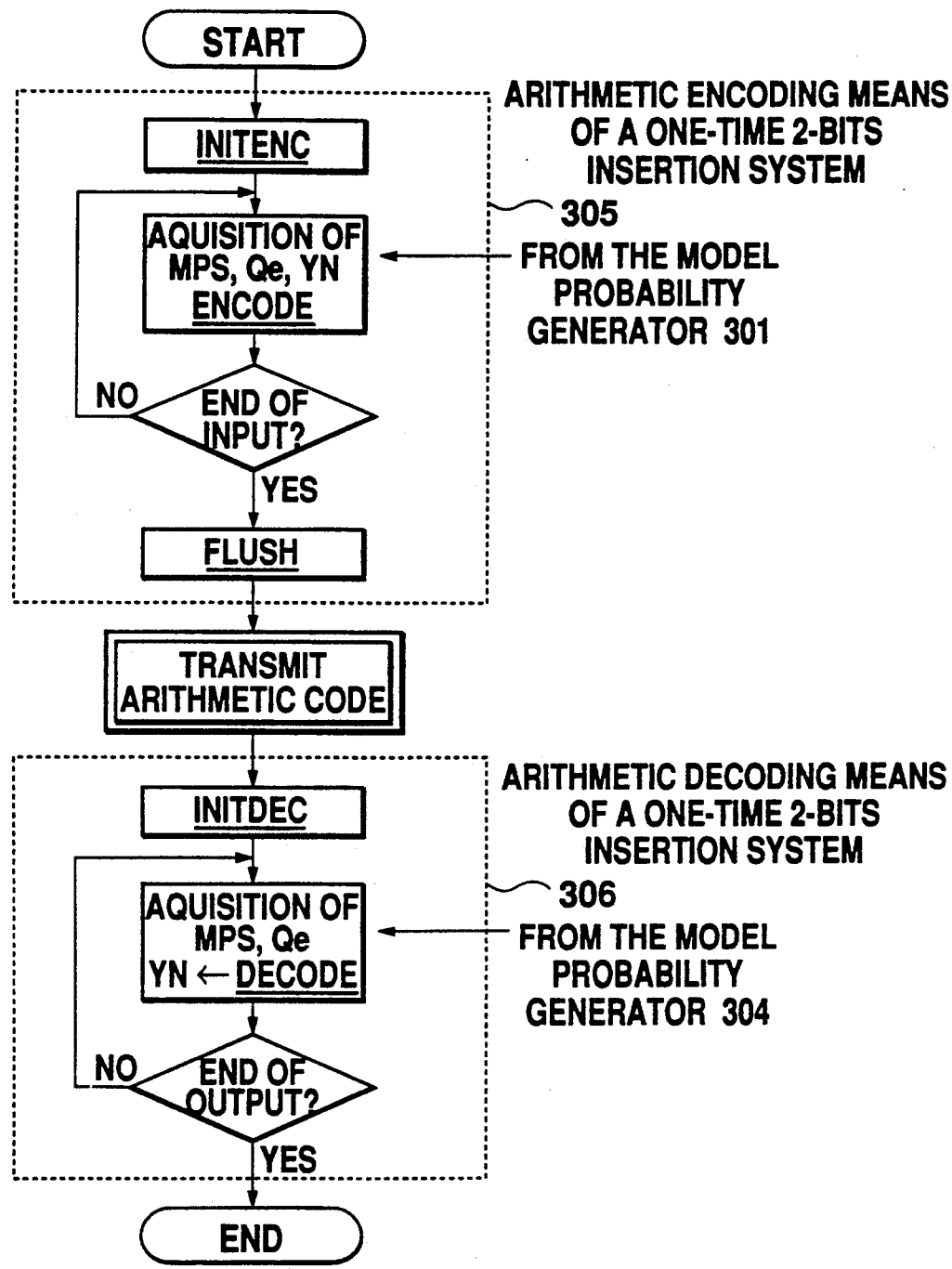
FIG. 5 is a flowchart of an arithmetic encoding means of a one-time 2-bits insertion system using the arithmetic encoder of a one-time 2-bits insertion system shown in FIG. 4 and an arithmetic decoding means of a one-time 2-bits insertion system using the arithmetic decoder of a one-time 2-bits insertion system shown in FIG. 4.

The arithmetic encoder 302 of a one-time 2-bits insertion system encodes a symbol by an arithmetic encoding means 305 in accordance with the flowchart shown in FIG. 5.

Figure 30:
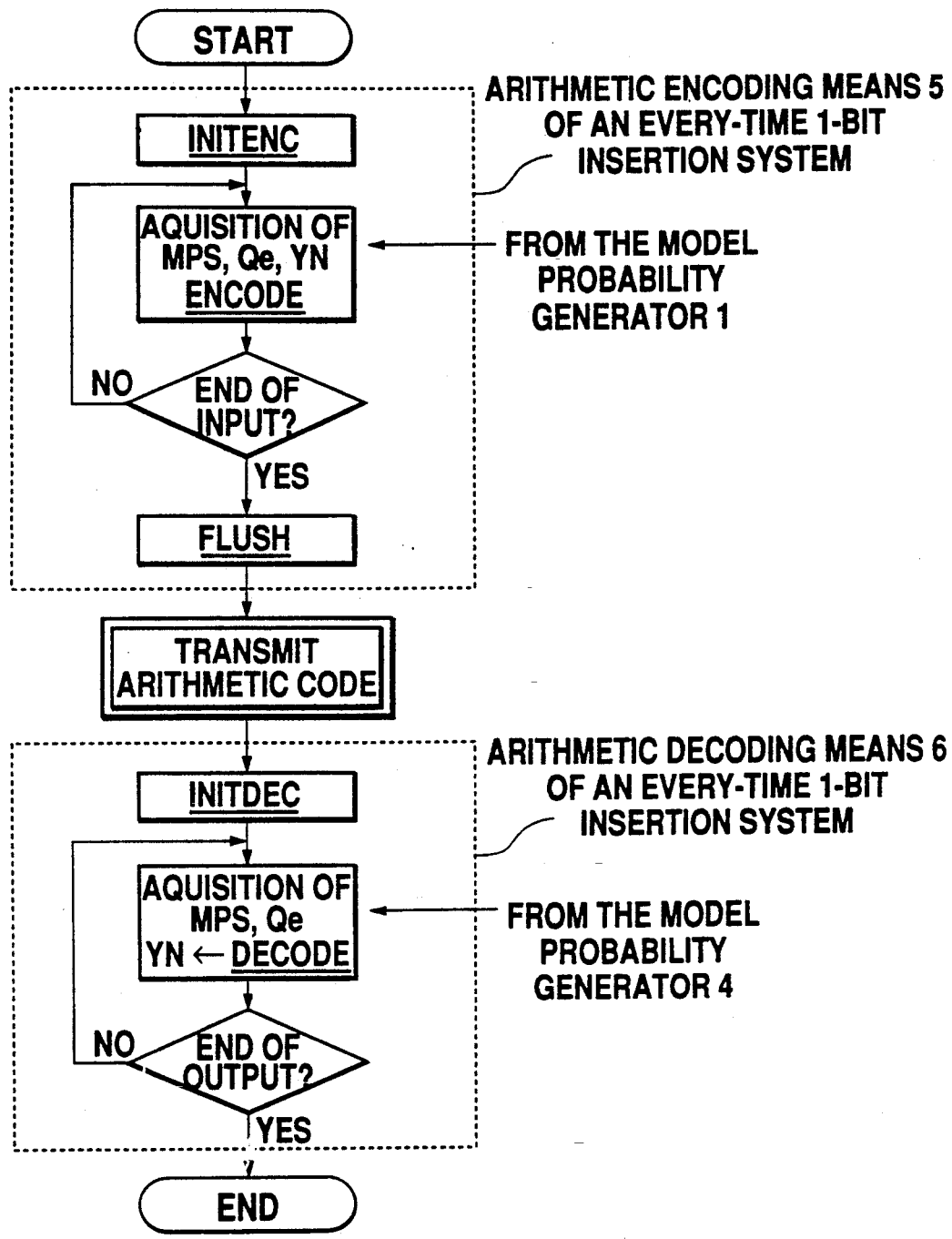
FIG. 30 is a flowchart of an arithmetic encoding means of an every-time 1-bit insertion system using the arithmetic encoder of an every-time 1-bit insertion system shown in FIG. 29 and an arithmetic decoding means of an every-time 1-bit insertion system using the arithmetic decoder of an every-time 1-bit insertion system shown in FIG. 29.

The function of each routine of INITENC, the acquisition of MPS, Qe and YN, ENCODE and FLUSH are the same as that used in the arithmetic encoding means 5 of an every-time 1-bit insertion system shown in FIG. 30.

Figure 31:
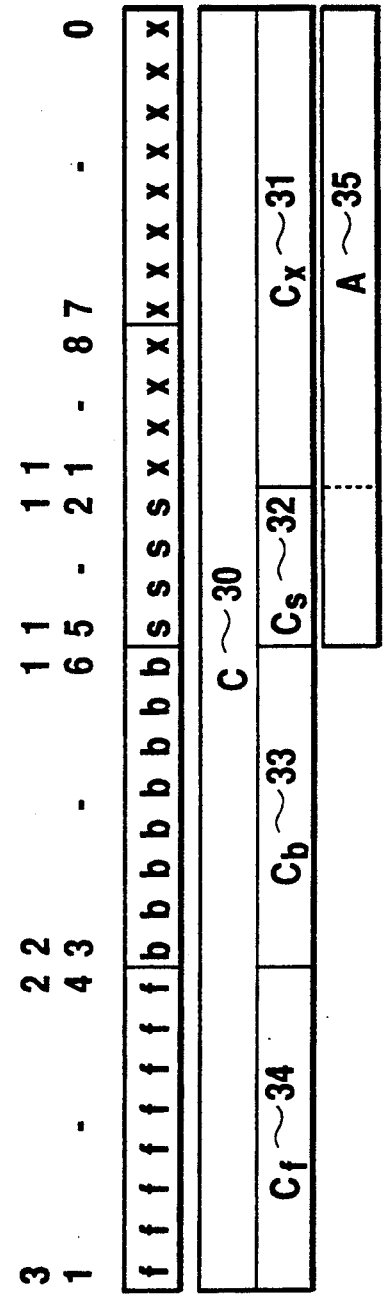
FIG. 31 shows the structure of a C-register and an A-register of the arithmetic encoder shown in FIG. 29.
Figure 32:
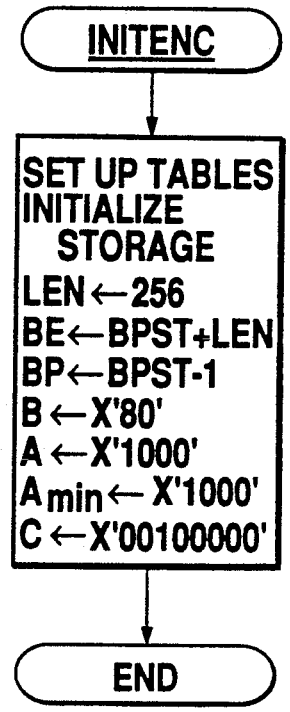
FIG. 32 is a flowchart of INITENC, which is a routine for initialization at the start of the encoding process of the every-time 1-bit insertion system shown in FIG. 30.
Figure 33:
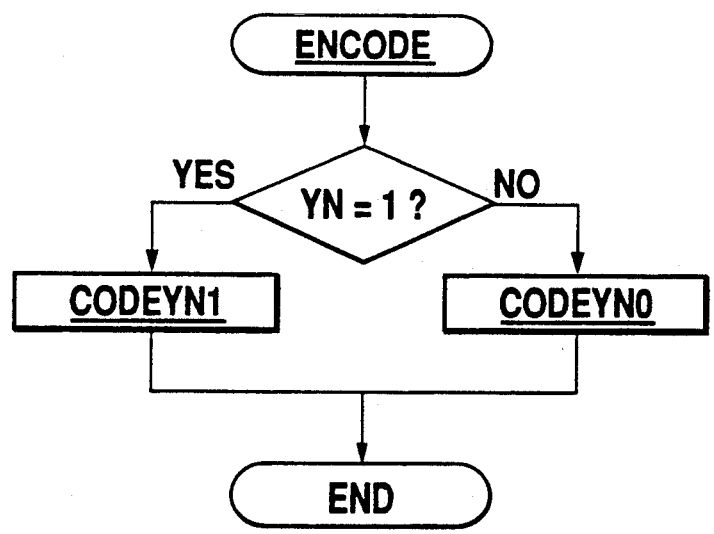
FIG. 33 is a flowchart of ENCODE which is a routine for actually processing the encoding operation.
Figure 34:
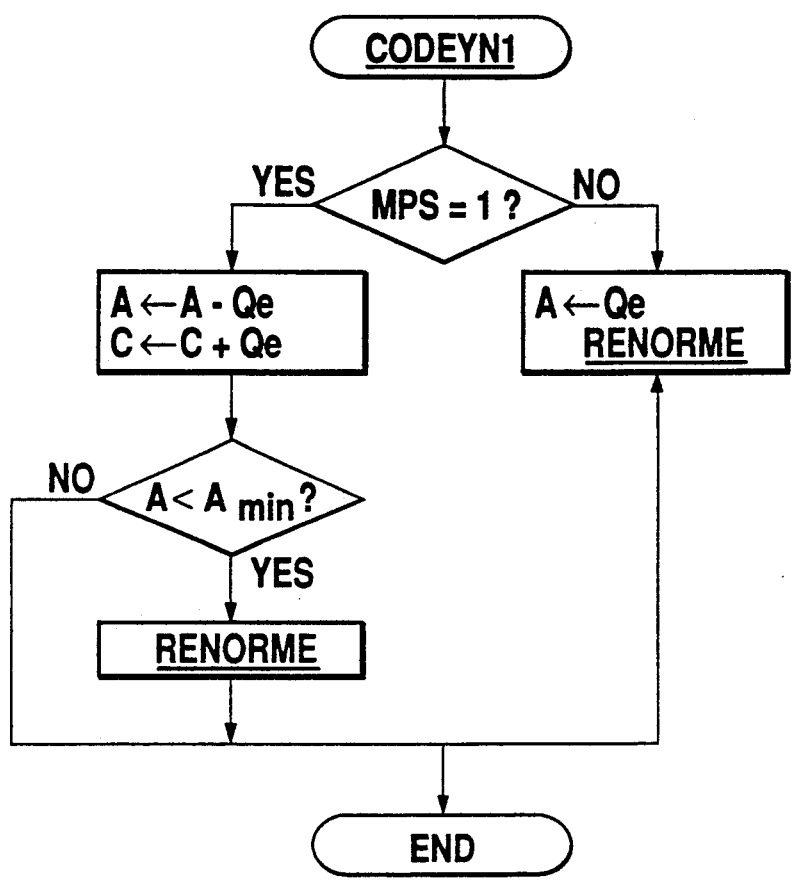
FIG. 34 is a flowchart of CODEYN1, which is a routine for processing the input value YN11="1"
Figure 35:
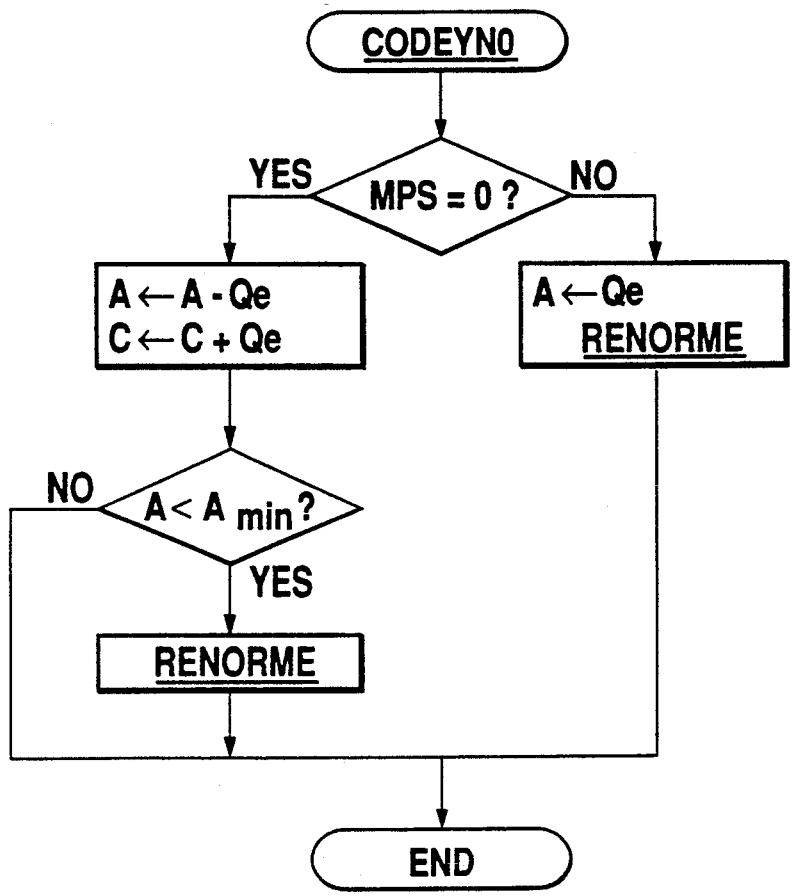
FIG. 35 is a flowchart of CODEYN0, which is a routine for processing the input value YN11="0"
Figure 36:
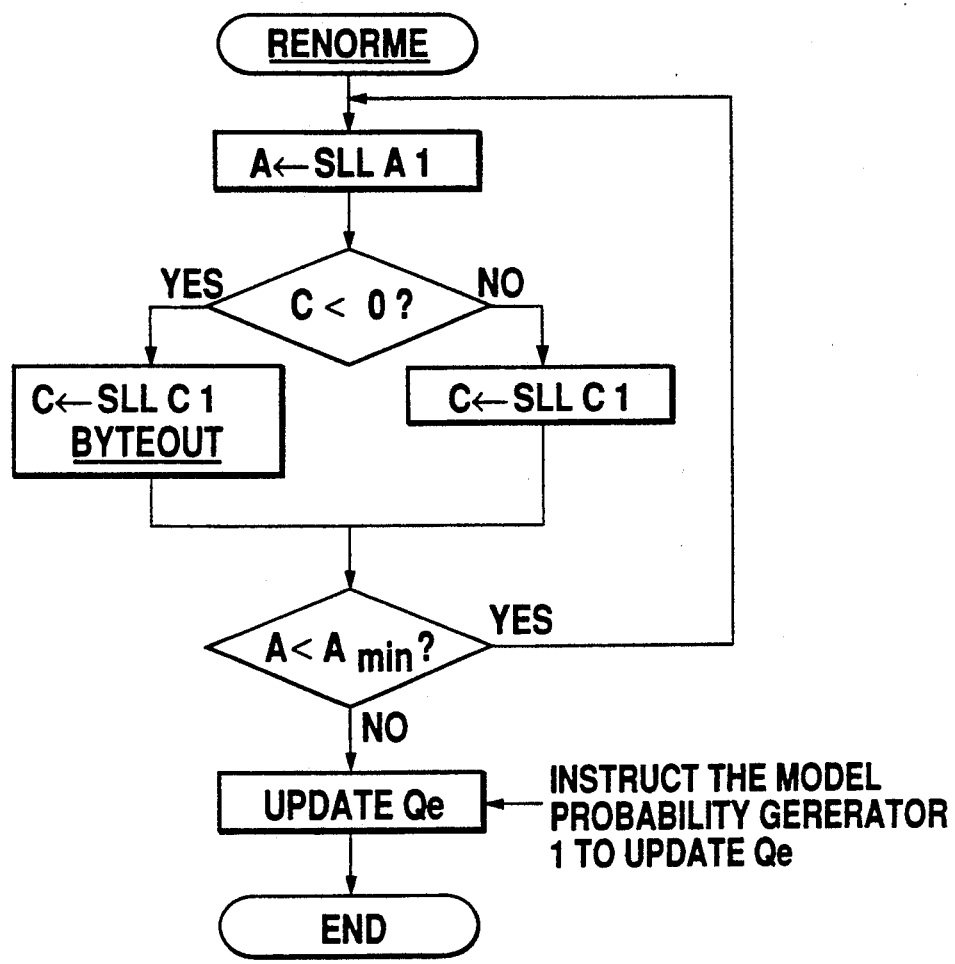
FIG. 36 is a flowchart of RENORME, which is a routine for renormalization in the encoding process shown in FIGS. 34 and 35.
Figure 37:
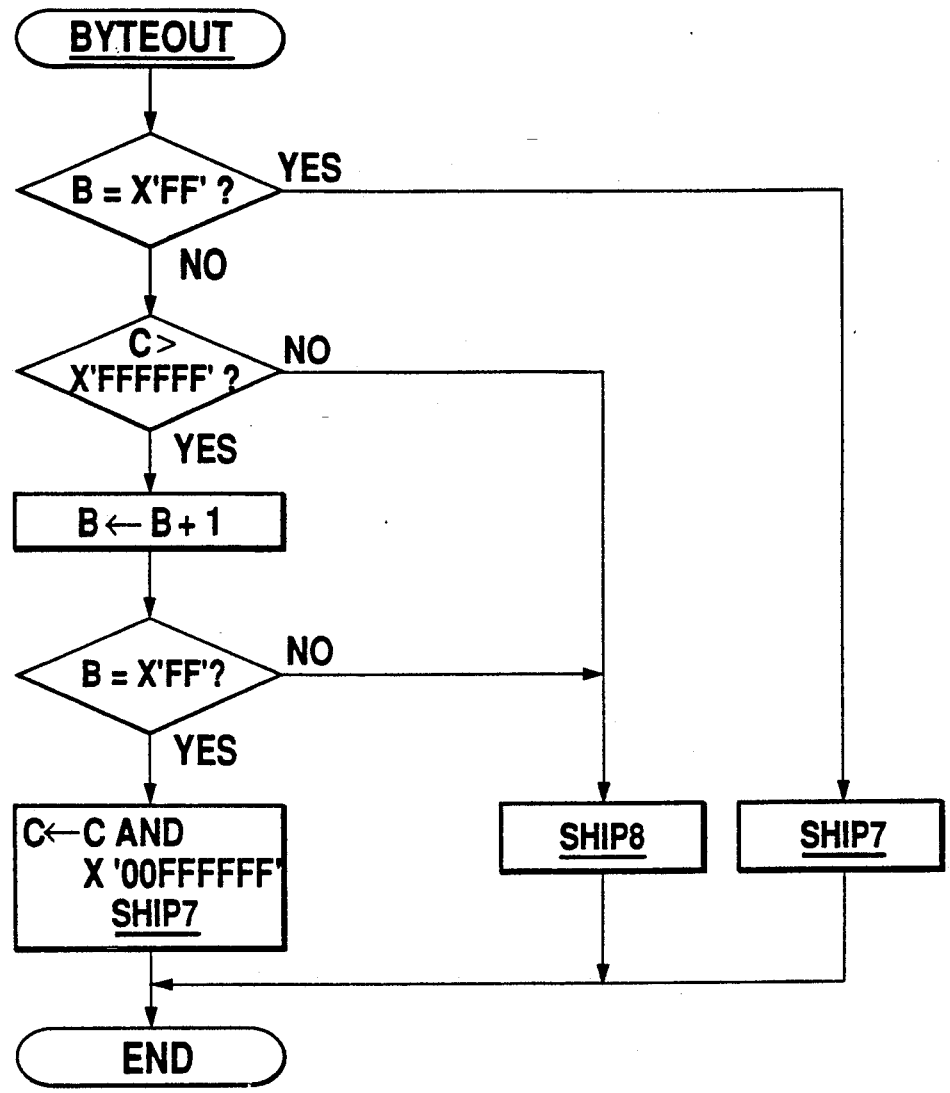
FIG. 37 is a flowchart of BYTEOUT, which is a routine for outputting an arithmetic code by an every-time 1-bit insertion system.
Figure 38:
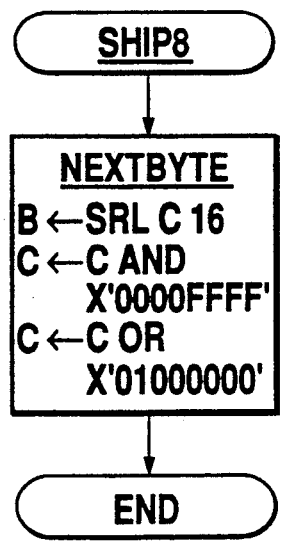
FIG. 38 is a flowchart of SHIP8, which is a routine for outputting 8 bits by the every-time 1-bit insertion system shown in FIG. 37.
Figure 39:
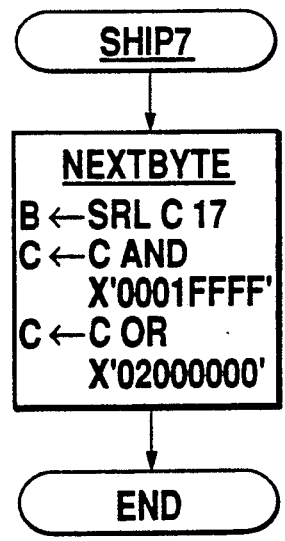
FIG. 39 is a flowchart of SHIP7, which is a routine for outputting 7 bits by the every-time 1-bit insertion system shown in FIG. 37.
Figure 40:
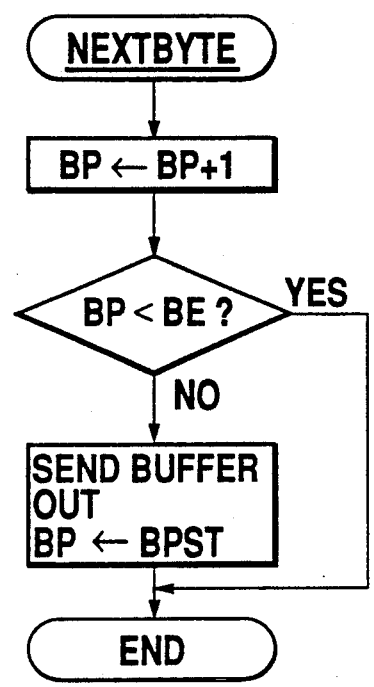
FIG. 40 is a flowchart of NEXTBYTE, which is a routine for updating a buffer value B by the every-time 1-bit insertion system shown in FIGS. 38, 39, 43 and 44.
Figure 41:
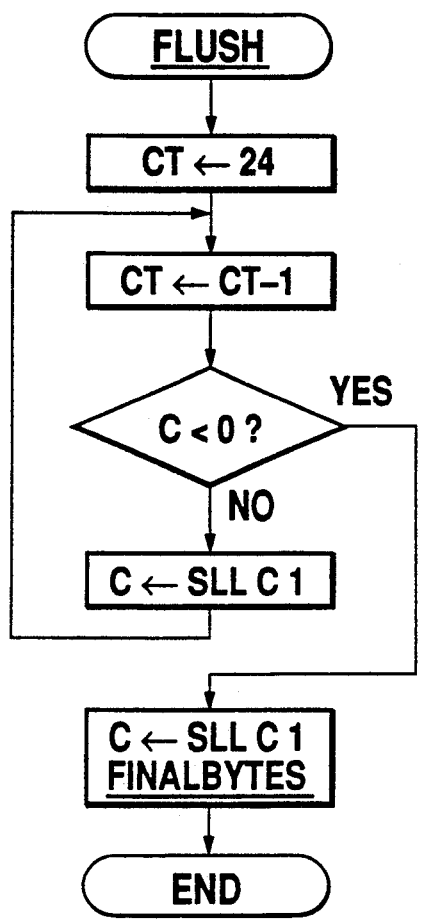
FIG. 41 is a flowchart of FLUSH, which is a routine for postprocessing of the encoding operation by the every-time 1-bit insertion system shown in FIG. 30.
Figure 42:
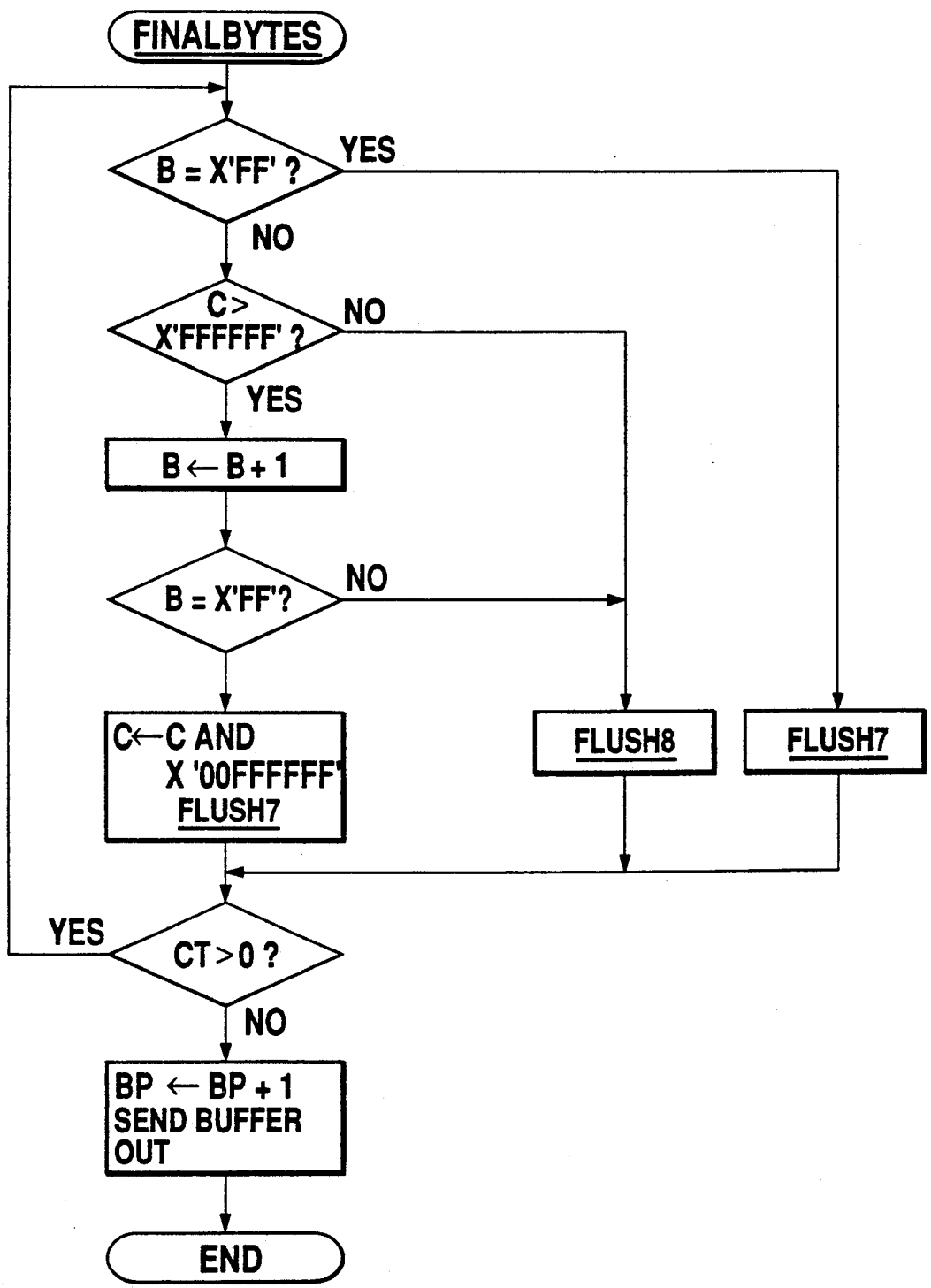
FIG. 42 is a flowchart of FINALBYTES, which is a routine for processing the final output of the arithmetic code by the every-time 1-bit insertion system shown in FIG. 41.
Figure 43:
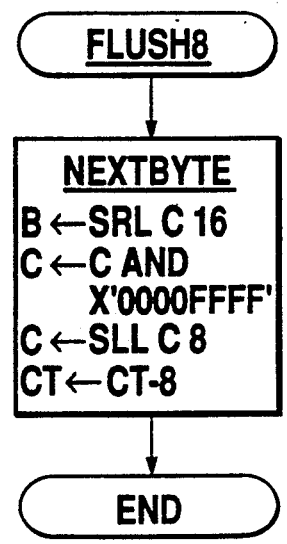
FIG. 43 is a flowchart of FLUSH8, which is a routine for sweeping out 8 bits by the every-time 1-bit insertion system shown in FIG. 42.
Figure 44:
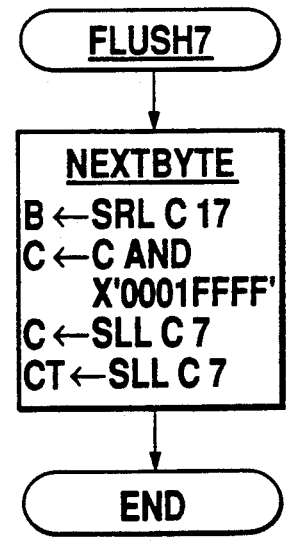
FIG. 44 is a flowchart of FLUSH7, which is a routine for sweeping out 7 bits by the every-time 1-bit insertion system shown in FIG. 42.

The specifications of a C-register (Cx-register, Cs-register, Cd-register, Cf-register) and an A-register of the arithmetic encoder 302 of a one-time 2-bits insertion system are the same as those of the registers of the arithmetic encoder 2 of an every-time 1-bit insertion system shown in FIG. 31.

Figure 6:
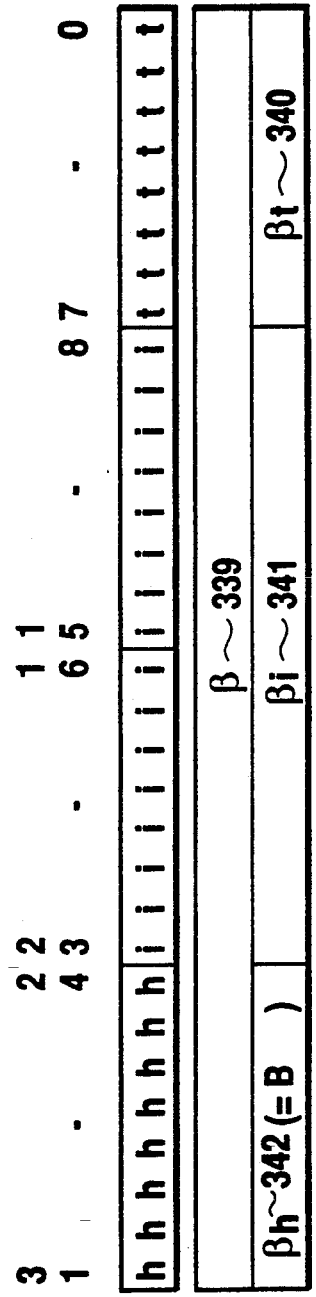
FIG. 6 shows the structure of a β-buffer of the arithmetic encoder shown in FIG. 4.

A $\beta$-buffer 339 is composed of a register of 32 bits, as shown in FIG. 6. The 8-buffer 339 is divided into a $\beta$t-buffer 340 of bit 0 to bit 7, a $\beta$i-buffer 341 of bit 8 to bit 23, and a $\beta$h-buffer 342 of bit 24 to bit 31.

Figure 7:
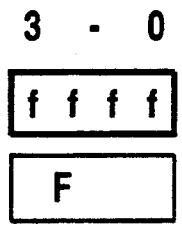
FIG. 7 shows the structure of an F-register of the arithmetic encoder shown in FIG. 4.

The arithmetic code 315 (data stored in the Cb-register or the bits 18 to 25) supplied from the C-register is shifted to the left by 8 bits before it is fetched by the $\beta$t-buffer 340, and the arithmetic code 315 stored in the $\beta$h-buffer 342 is supplied to the B-buffer. The $\beta$-buffer 339 has the function of internally propagating the carry detected by the C-register, and the $\beta$h-buffer 342 overlaps with the B-buffer. The F-register 343 is composed of a register of 4 bits, as shown in FIG. 7. In the F-register 343, whenever the arithmetic code 315 (stored in the Cb-register or the bits 18 to 25) of 1 byte is supplied from the C-register, a 1-bit shifting process is executed. As a result, it is possible to fetch any given bit at the least significant bit. In the F-register 343, it is possible to simultaneously clear all bits to "0" instead of the above-described shifting process. The F-register 343 is provided for the purpose of processing a carry control signal which is inserted over the 8-buffer and the adjacent buffer at its left by a carry operation.

The encoding operation by the arithmetic encoding means 305 of a one-time 2-bits insertion system will be explained with reference to the following flowcharts. The variables and constants used in the flowcharts are the same as those used by the arithmetic encoding means 5 of an every-time 1-bit insertion system except that the $\beta$-buffer value and the F-register value are added thereto.

| | | |
|---|---|---|
| $\beta$ | $\beta$-buffer value | 339 |
| $\beta$t | $\beta$t-buffer value (bit 0 to bit 7) | 340 |
| $\beta$i | $\beta$i-buffer value (bit 8 to bit 23) | 341 |
| $\beta$h | $\beta$h-buffer value (bit 24 to 31: = B-buffer) | 342 |
| F-register | | 343 |

The operation of each processing will be explained hereinunder with reference to a flowchart.

Figure 8:
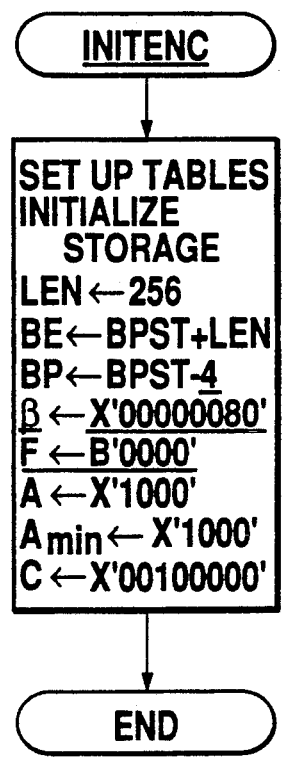
FIG. 8 is a flowchart of INITENC, which is a routine for initialization at the start of the encoding process of a one-time 2-bits insertion system shown in FIG. 5.

FIG. 8 is a flowchart of the detailed operation of the INITENC routine for initialization at the start of the encoding process. As shown in FIG. 8, tables are set up and a storage unit is initialized.

A region for the arithmetic code buffer is secured and set up in the storage unit. The buffer pointer BP indicates the address preceding the first address BPST of the arithmetic code buffer, and the $\beta$-buffer value 339$\beta$ is set to X'00000080' as a value other than X'FFFFFFFF', which has a special meaning. In the F-register 343, B'0000' (binary notation, a binary number will be represented by "B'n'" hereinunder) is set as an initial value. The minimum effective region width Amin is set in the A-register and Amin is not changed and treated as a constant during the encoding operation. In the C-register, an output flag "1" is only set in the Cf-register. Since the arithmetic code to be output in the encoding initiated state is in the Cx-register value (fixed point part), an output flag "1" is set in the Cb-register (bit 20) so that the first output is supplied when the bit 11 reaches the most significant bit (bit 23) of the Cb-register.

The detailed operations of the ENCODE routine for actually processing the encoding operation, the CODEYN1 routine for processing the input value YN11="1", the CODEYN0 routine for processing the input value YN11="0", and the RENORME routine for the renormalization process of encoding are shown in the flowcharts in FIGS. 32, 33, 34 and 35, respectively. That is, these operations are the same as those of the arithmetic encoding means 5 of an every-time 1-bit insertion system.

Figure 9:
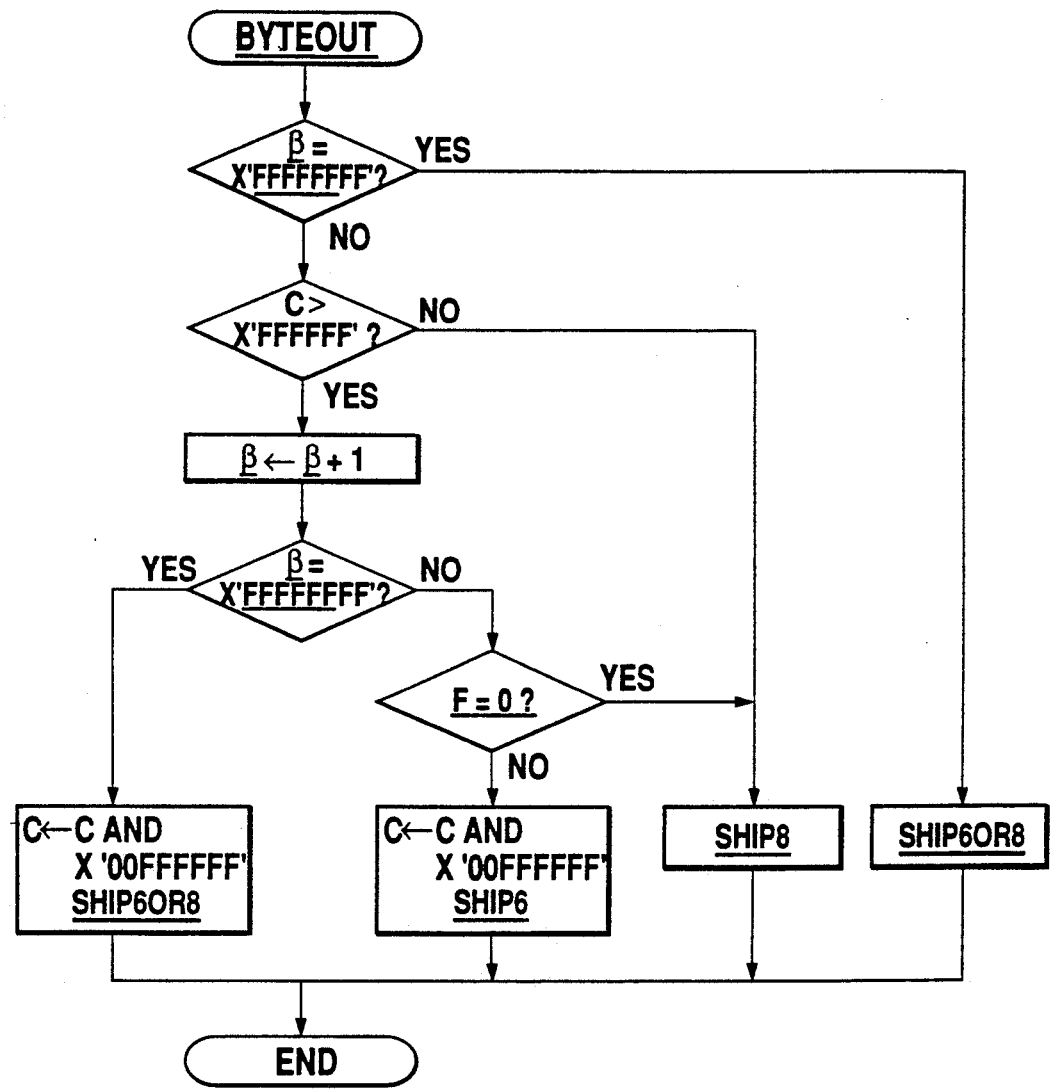
FIG. 9 is a flowchart of BYTEOUT, which is a routine for outputting an arithmetic code by the one-time 2-bits insertion system.

FIG. 9 is a flowchart of the detailed operation of the BYTEOUT routine for outputting the arithmetic code 315. As shown in FIG. 9, if the β-buffer value 339β is X'FFFFFFFF', a 6- or 8-bits outputting process SHIP-6OR8 is executed.

On the other hand, if the β-buffer value 339β is not X'FFFFFFFF' and the C-register value is not larger than X'FFFFFF', an 8-bits outputting process SHIP8 is executed.

If the β-buffer value 339β is not X'FFFFFFFF' and the C-register value is larger than X'FFFFFF', a carry is propagated to the β-buffer 339. In other words, 339β is incremented by 1. The case in which the C-register value is larger than X'FFFFFF' is a case in which a carry is propagated to the least significant bit (carry bit) of the Cf-register through the Cs-register and the Cb-register by the addition of the LPS region width Qe314. If the β-buffer value 339β becomes X'FFFFFFFF' as a result of the propagation, the carry bit of the C-register (already propagated to the β-buffer 339) is cleared and the 6- or 8-bits outputting process SHIP6OR8 is executed.

If the β-buffer value 339β is not X'FFFFFFFF' and the F-register value is "0", the 8-bits outputting process SHIP8 is executed. On the other hand, if the β-buffer value 339β is not X'FFFFFFFF' and the F-register value is not "0", the carry bit of the C-register (already propagated to the β-buffer 339) is cleared and a 6-bits outputting process SHIP6 is executed.

Figure 10:
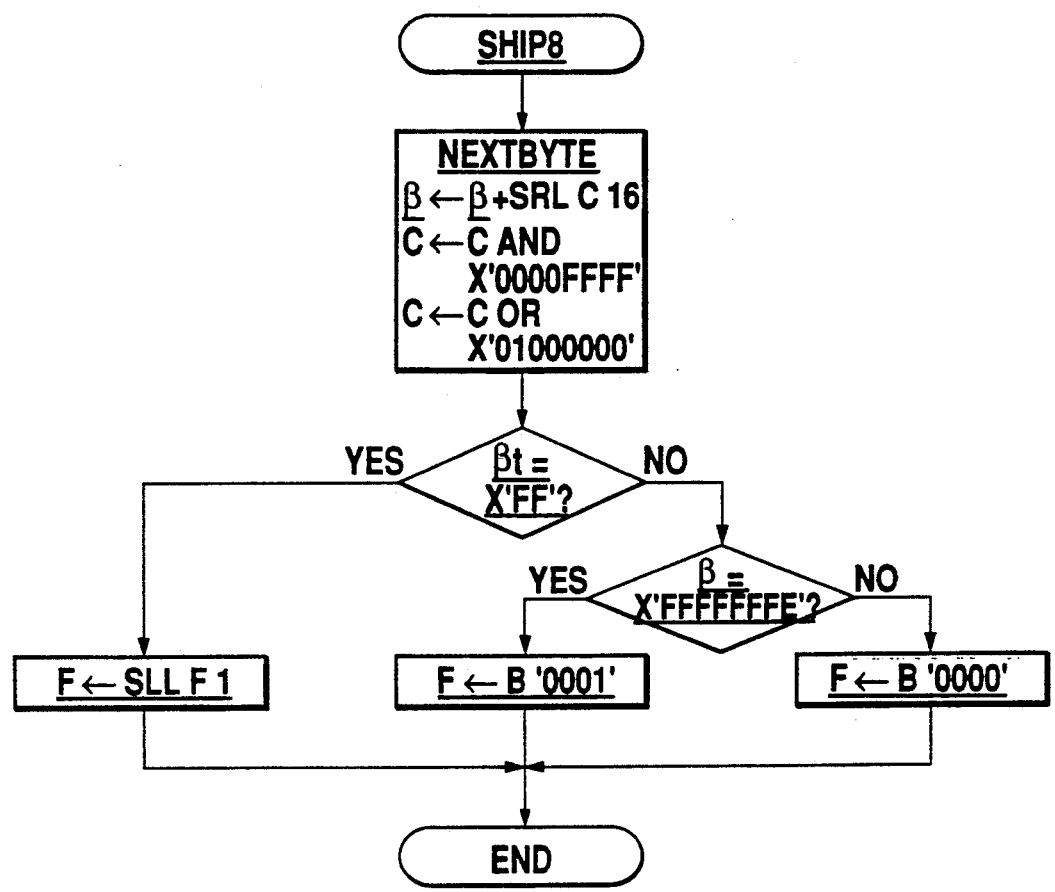
FIG. 10 is a flowchart of SHIP8, which is a routine for outputting 8 bits by the one-time 2-bits insertion system shown in FIG. 9.

FIG. 10 is a flowchart of the detailed operation of the routine SHIP8 for outputting 8 bits. As shown in FIG. 10, a NEXTBYTE routine for updating the B-buffer value 336B is first executed. Thereafter the value obtained by shifting the C-register value to the right by 16 bits, namely, the value of the Cb·register (bits 16 to 23) is added to the βt-buffer value 340βt. The bits already output from the C-register or the unnecessary bits (bits 16 to 31) therein are cleared from the C-register. An output flag "1" is set at the bit 24 of the C-register so that the BYTEOUT routine is executed when the most significant bit (i,e, bit 15) of the remaining bits reaches the most significant bit (bit 23) of the Cb-register by renormalization.

Judgment is then made as to whether or not the βt-buffer value 340βt is the byte X'FF'. If the answer is in the affirmative, the value of the F-register 343 is shifted to the left (SLL: Shift Left Logical) by 1 bit.

On the other hand, if the βt-buffer value 340βt is not X'FF', whether or not the β-buffer value 339β is X'FFFFFFFE' is judged. If the β-buffer value 339β is X'FFFFFFFE', B'0001' is substituted into the value of the F-register 343, and if it is not X'FFFFFFFE', B'0000F' is substituted thereinto.

Figure 11:
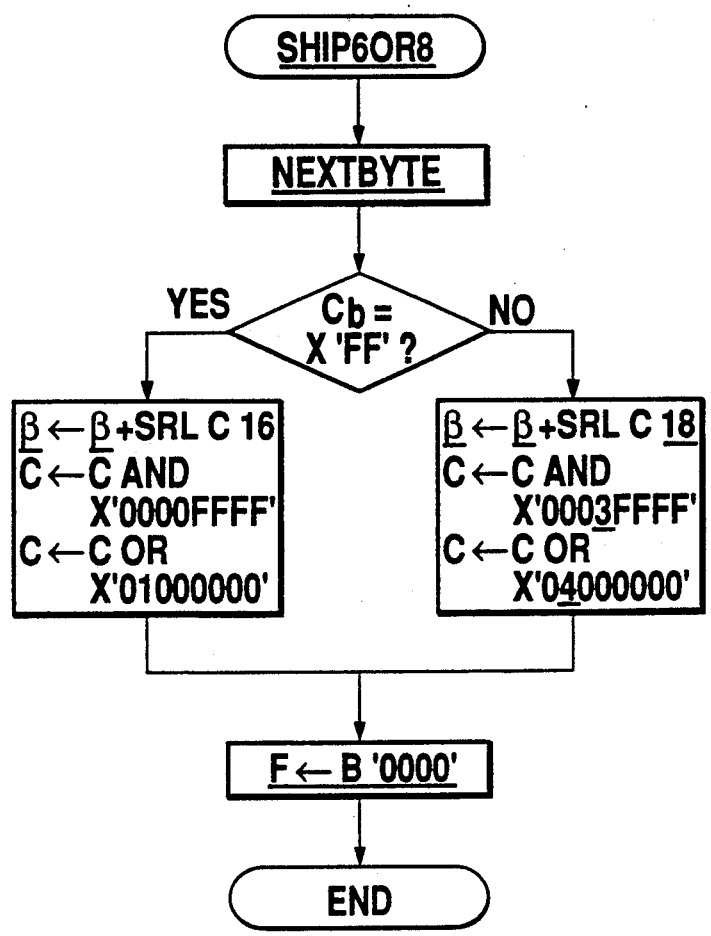
FIG. 11 is a flowchart of SHIP6OR8, which is a routine for outputting 6 or 8 bits by the one-time 2-bits insertion system shown in FIG. 9.

FIG. 11 is a flowchart of the detailed operation of the routine SHIP6OR8 for outputting 6 or 8 bits. As shown in FIG. 11, the NEXTBYTE routine for updating the B-buffer value 336B is first executed. Thereafter judgment is made as to whether or not the Cb-register value is the byte X'FF'. If the Cb-register value is the byte X'FF', the byte X'FF' is stored as it is in the βt-buffer 340. That is, the value obtained by shifting the C-register value to the right by 16 bits, namely, the Cb-register value (bits 16 to 23) is stored in the βt-buffer 340. The bits already output from the C-register or the unnecessary bits (bits 16 to 31) therein are substituted by "0". An output flag "1" is set at the bit 24 so that the BYTEOUT routine is executed when the most significant bit (bit 15) of the remaining bits (bits 0 to 15) reaches the most significant bit (bit 23) of the Cb-register by renormalization.

On the other hand, if the Cb-register value is not the byte X'FF', the data other than the byte X'FF' subsequent to X'FFFFFFFF' of 4 bytes (or more) is output. The value obtained by shifting the C-register value to the right by 18 bits, namely, the first 6 bits (bits 18 to 23) of the Cb-register and the last 2 bits (bits 24 and 25; the bit 25 at this time is constantly "0") of the Cf-register is substituted into the B-buffer value 336B. The bits 24 and 25 substituted into the B-buffer value 336B are inserted into the arithmetic code 315 as a carry control signal at the position of the first 2 bits of the byte other than X'FF' subsequent to X'FFFFFFFF' (or "X'FF'"s of at least four consecutive bytes), which is the β-buffer value 339β. The bits already output from the C-register or the unnecessary bits (bits 18 to 31) therein are cleared. An output flag "1" is set at the bit 26 so that the BYTEOUT routine is executed when the most significant bit (bit 17) of the remaining bits (bits 0 to 17) reaches the most significant bit (bit 23) of the Cb-register by renormalization.

As described above, whether the Cb-register value is the byte X'FF' or not, B'0000F' is finally substituted into the value of the F-register 343.

Figure 12:
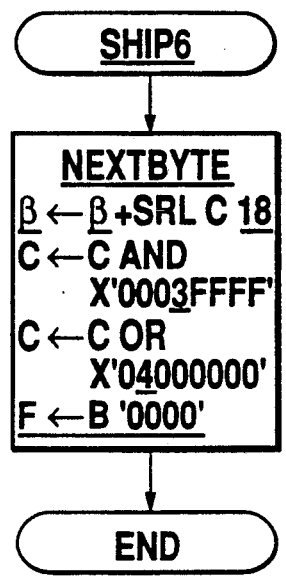
FIG. 12 is a flowchart of SHIP6, which is a routine for outputting 6 bits by the one-time 2-bits insertion system shown in FIG. 9.

FIG. 12 is a flowchart of the detailed operation of the routine SHIP6 for outputting 6 bits. As shown in FIG. 12, the NEXTBYTE routine for updating the B-buffer value 336B is first executed. The value obtained by shifting the C-register value to the right by 18 bits, namely, the 6 bits (bits 18 to 23) of the Cb-register and the last 2 bits (bits 24 and 25; the bit 25 at this time is constantly "0") of tee Cf-register is substituted into the B-buffer value 336B. The bits 24 and 25 substituted into the B-buffer value 336B are inserted into the arithmetic code 315 as a carry control signal at the position of the first 2 bits of the byte other than X'FF' subsequent to X'FFFFFFFF' (or "X'FF'"s of at least four consecutive bytes), which is the β-buffer value 339β. The bits already output from the C-register or the unnecessary bits (bits 18 to 31) therein are cleared. An output flag "1" is set at the bit 26 so that the BYTEOUT routine is executed when the most significant bit (bit 17) of the remaining bits (bits 0 to 17) reaches the most significant bit (bit 23) of the Cb-register by renormalization. B'0000F' is finally substituted into the value of the F-register 343.

Figure 13:
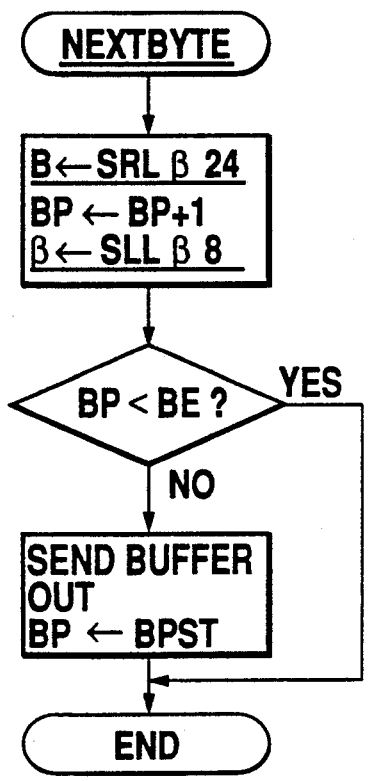
FIG. 13 is a flowchart of NEXTBYTE, which is a routine for updating a 8-buffer value by the one-time 2-bits insertion system shown in FIGS. 10, 11, 16 and 17.

FIG. 13 is a flowchart of the detailed operation of the routine NEXTBYTE for updating the B-buffer value 336B. As shown in FIG. 13, after the value obtained by shifting the β-buffer value 339β to the right by 24 bits, namely, the βh-buffer value 342βh is substituted into the β-buffer value 339β, the buffer pointer BP is incremented by 1. Thereafter, the β-buffer value 339β is shifted to the left by 8 bits.

If the buffer pointer BP is not smaller than (i,e, equal to) the last address BE of the arithmetic code buffer, the arithmetic code 315 stored in the arithmetic code buffer is transmitted, and the buffer pointer BP is reset to the first address BPST of the arithmetic code buffer.

Figure 14:
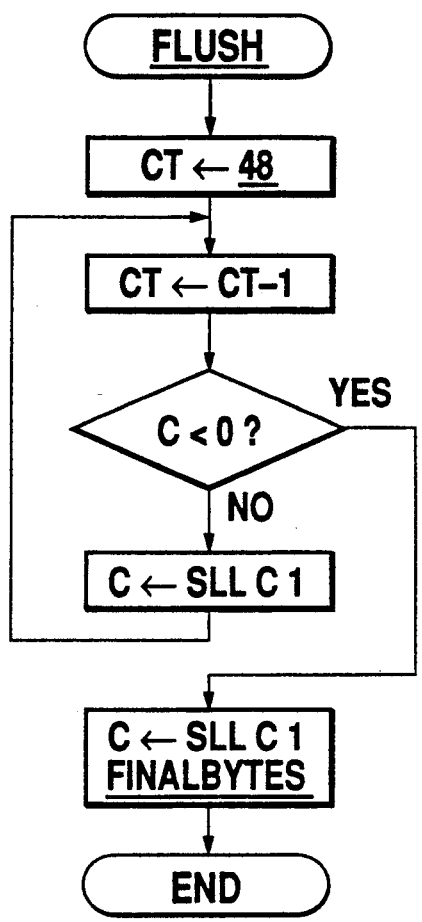
FIG. 14 is a flowchart of FLUSH, which is a post-processing routine of the encoding operation by the one-time 2-bits insertion system shown in FIG. 5.

FIG. 14 is a flowchart of the detailed operation of the routine FLUSH as a postprocessing of the encoding operation. As shown in FIG. 14, the count value CT for postprocessing is set to "48", which is equal to the total number of bits necessary for sweeping out the Cx-register portion, the Cs-register portion, the Cb-register portion, the βt-buffer portion 340 and the βi-buffer portion 33. The count value CT for postprocessing is then decremented by 1. If the C-register value is not negative, that is, if an output flag "1" is not situated at the most significant bit, after the C-register value is shifted to the left by 1 bit, the process returns to the count value CT decrementing process, and the above-described processings are repeated. On the other hand, if the C-register value is negative, after the C-register value is shifted to the left by 1 bit, a FINALBYTES routine for finally outputting the arithmetic code 315 is executed.

Figure 15:
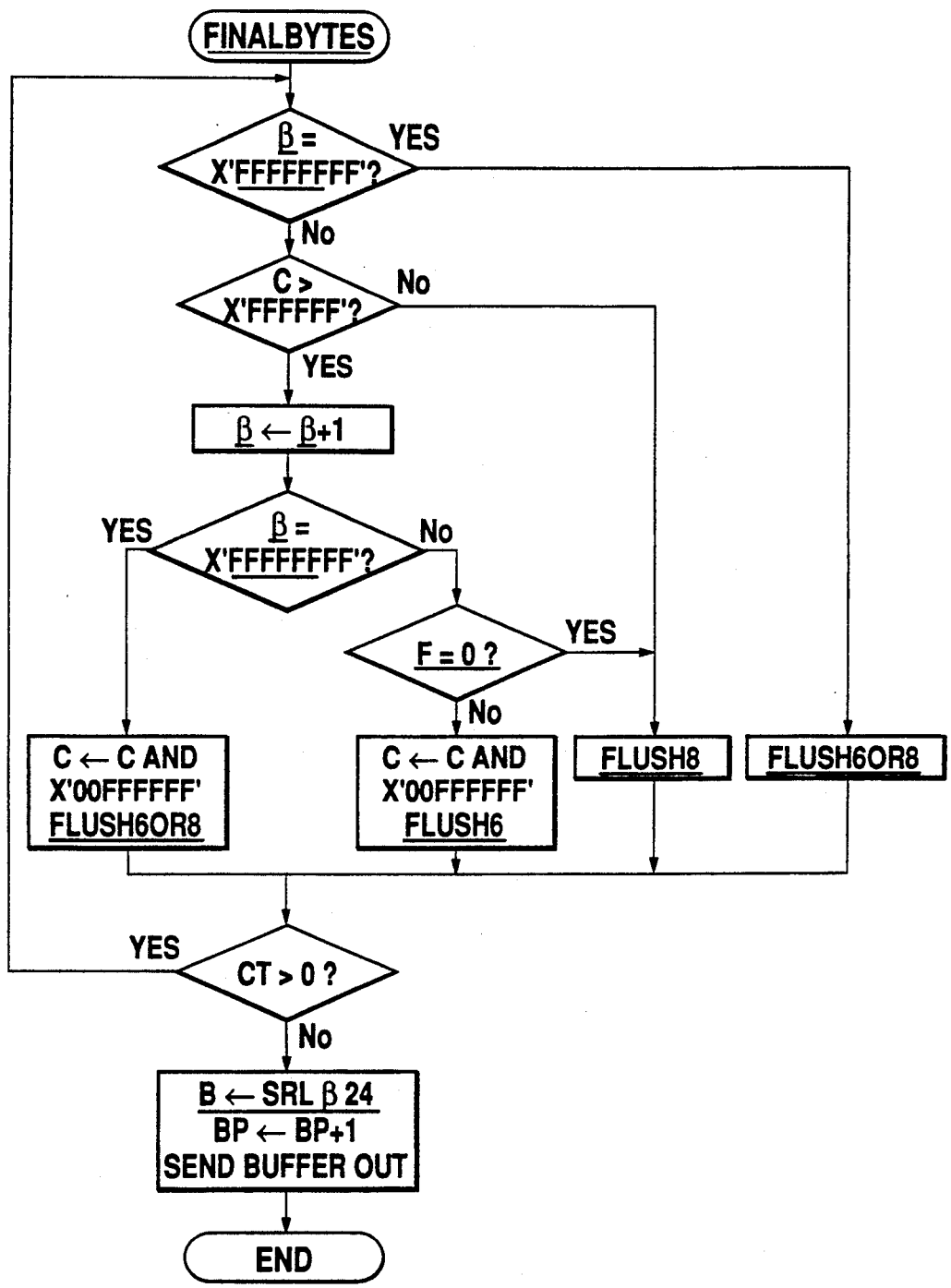
FIG. 15 is a flowchart of FINALBYTES, which is a routine for processing the final output of the arithmetic code by the one-time 2-bits insertion system shown in FIG. 14.

FIG. 15 is a flowchart of the detailed operation of the routine FINALBYTES for finally outputting the arithmetic code 315. As shown in FIG. 15, if the β-buffer value 339β is X'FFFFFFFF', a 6- or 8-bits sweeping-out process FLUSH 6OR8 is executed.

If the β-buffer value 339β is not X'FFFFFFFF' and the C-register value is larger than X'FFFFFF', a carry is propagated to the β-buffer 339. The case in which the C-register value is larger than X'FFFFFF' is a case in which a carry is propagated to the least significant bit (carry bit) of the Cf-register through the Cs-register and the Cb-register by the addition of the LPS region width Qe314. If the β-buffer value 339β becomes X'FFFFFFFF' as a result of the propagation, the carry bit (already propagated to the β-buffer 339) of the C-register is cleared, and the 6- or 8-bits sweeping-out process FLUSH6OR8 is executed. On the other hand, if the β-buffer value 339β is not X'FFFFFFFF' and the value of the F-register 343 is "0", an 8-bits sweeping-out process FLUSH8 is executed. If the value of the F-register 343 is not "0", the carry bit (already propagated to the β-buffer 339) of the C-register is cleared, and an 6-bits sweeping-out process FLUSH6 is executed.

If the β-buffer value 339β is not X'FFFFFFFF' and the C-register value is not larger than X'FFFFFF', an 8-bits sweeping-out process FLUSH8 is executed. If the count value CT for postprocessing is positive after the 8-bits sweeping-out process FLUSH8 or the 6- or 8-bits sweeping-out process FLUSH6OR8 is executed, the above-described process is repeated from the judgment as to whether or not the β-buffer value 339β is X'FFFFFFFF'. On the other hand, if the count value CT for postprocessing is not positive, after the value obtained by shifting the β-buffer value 339β to the left by 24 bits, namely, the βh-buffer value 342β is substituted into the B-buffer value 336B, the buffer pointer BP is incremented by 1. If the stored arithmetic code 315 is not finished on the byte boundary, bits "0"s are added until the byte boundary. The stored arithmetic code 315 of (BP - BPST) bytes is transmitted from the first address BPST of the arithmetic code buffer, thereby finishing the encoding process.

Figure 16:
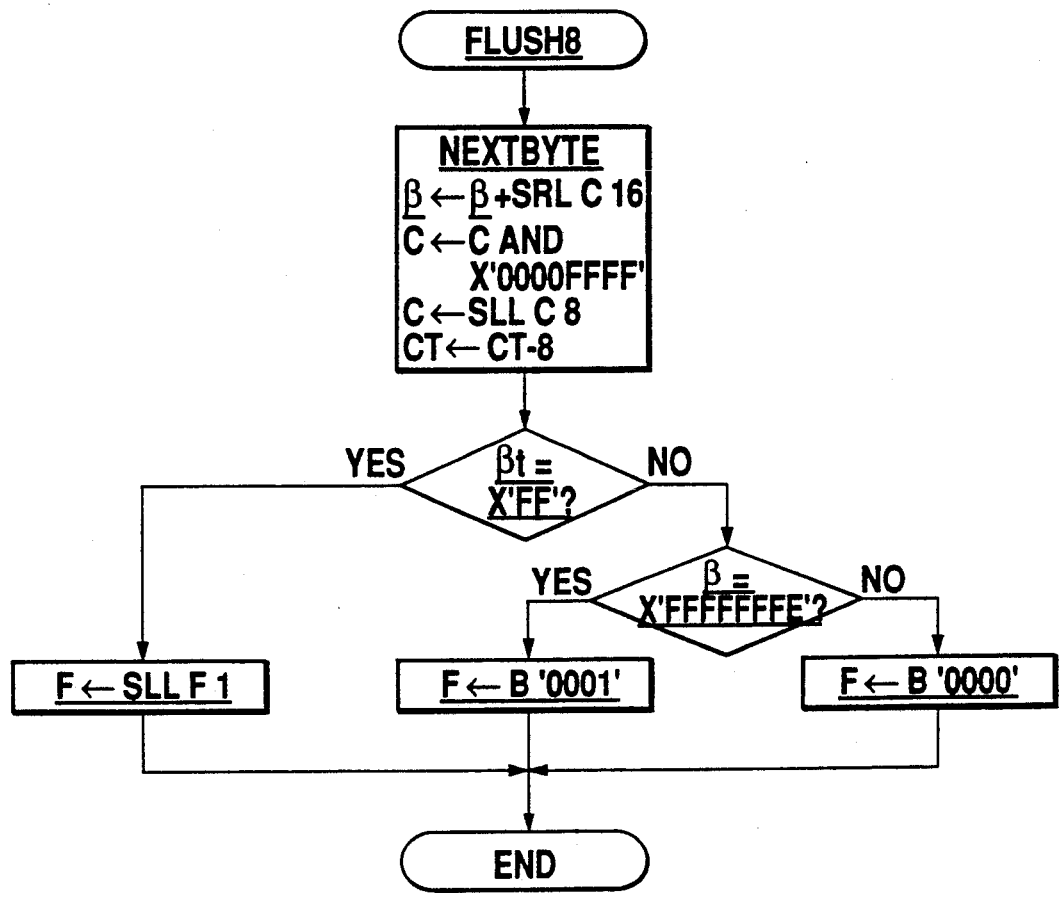
FIG. 16 is a flowchart of FLUSH8, which is a routine for sweeping out 8 bits by the one-time 2-bits insertion system shown in FIG. 14.

FIG. 16 is a flowchart of the detailed operation of the routine FLUSH8 as the 8-bits sweeping-out process. As shown in FIG. 16, the NEXTBYTE routine for updating the B-buffer value 336B is first executed. Thereafter the value obtained by shifting the C-register value to the right by 16 bits, namely, the Cb-register portion (bits 16 to 23) is substituted into the βt-buffer value 340βt. The bits already output from the C-register or unnecessary bits (bits 16 to 31) therein are cleared, and the C-register value is shifted to the left by 8 bits so that the most significant bit (bit 15) of the remaining bits (bits 0 to 15) reaches the most significant bit (bit 23) of the Cb-register. Simultaneously, 8 is subtracted from the count value CT for postprocessing.

If the βt-buffer value 340βt is the byte X'FF', the value of the F-register 343 is shifted to the left by 1 bit. If the βt-buffer value 340βt is not the byte X'FF' and the β-buffer value 339β is the byte X'FFFFFFFE', B'0001' is set as the value of the F-register 343. If the β-buffer value 339β is not the byte X'FFFFFFFE', B'0000F' is set as the value of the F-register 343.

Figure 17:
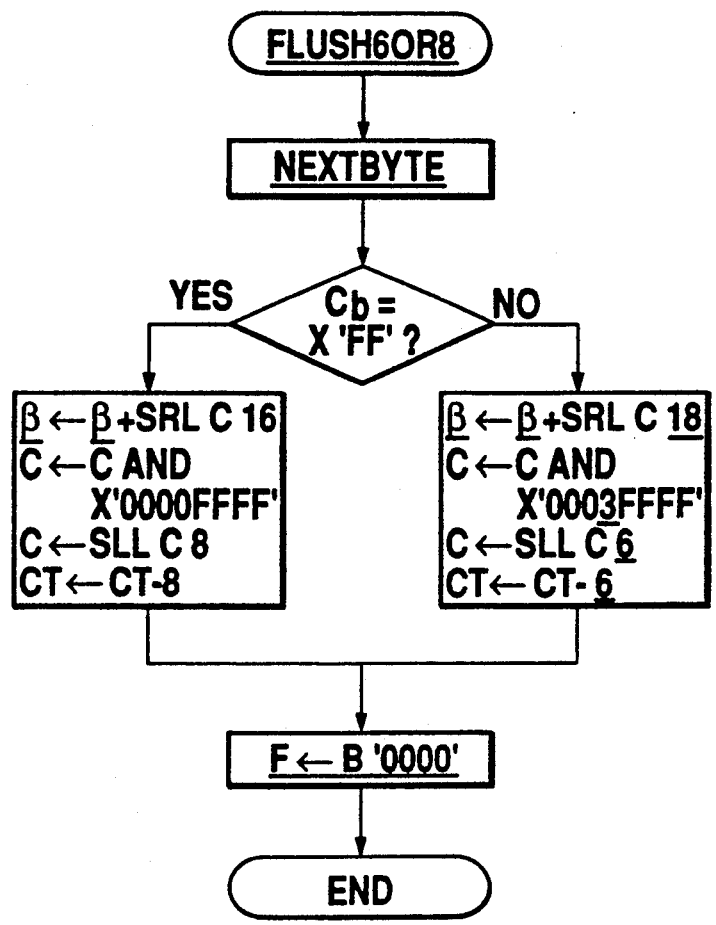
FIG. 17 is a flowchart of FLUSH6OR8, which is a routine for sweeping out 6 or 8 bits by the one-time 2-bits insertion system shown in FIG. 15.

FIG. 17 is a flowchart of the detailed operation of the routine FLUSH6OR8 as the 6- or 8-bits sweeping-out process. As shown in FIG. 17, the NEXTBYTE routine for updating the B-buffer value 336B is first executed. If the Cb-register value is the byte X'FF', the byte X'FF' is substituted as it is into the βt-buffer value 340βt until data other than the byte X'FF' is output. That is, the value obtained by shifting the C-register value to the right by 16 bits, namely, the Cb-register value (bits 16 to 23) is substituted into the βt-buffer value 340βt. The bits already output of the C-register or the unnecessary bits (bits 16 to 31) therein are cleared, and the C-register value is shifted to the left by 8 bits so that the most significant bit (bit 15) of the remaining bits (bits 0 to 15) reaches the most significant bit (bit 23) of the Cb-register by renormalization. Simultaneously, 8 is subtracted from the count value CT for postprocessing.

If the Cb-register value is not the byte X'FF', the data other than the byte X'FF' subsequent to X'FFFFFFFF' of 4 bytes (or more) is output. The value obtained by shifting the C-register value to the right by 18 bits, namely, the first 6 bits (bits 18 to 23) of the Cb-register and the last 2 bits (bits 24 and 25; the bit 25 at this time is constantly "0") of the Cf-register is substituted into the B-buffer value 336B. The bits 24 and 25 substituted into the B-buffer value 336B are inserted into the arithmetic code 315 as a carry control signal at the position of the first 2 bits of the byte other than X'FF' subsequent to X'FFFFFFFF' (or "X'FF'"s of at least four consecutive bytes), which is the β-buffer value 339β. The bits already output from the C-register or the unnecessary bits (bits 18 to 31) therein are cleared, and the C-register value is shifted to the left by 6 bits so that the most significant bit (bit 17) of the remaining bits (bits 0 to 17) reaches the most significant bit (bit 23) of the Cb-register. Simultaneously, 6 is subtracted from the count value CT for postprocessing. B'0000F' is set as the value of the F-register 343.

Figure 18:
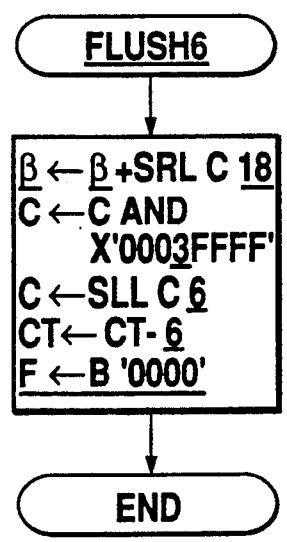
FIG. 18 is a flowchart of FLUSH6, which is a routine for sweeping out 6 bits by the one-time 2-bits insertion system shown in FIG. 8.

FIG. 18 is a flowchart of the detailed operation of the routine FLUSH6 as the 6-bits sweeping-out process. As shown in FIG. 18, the NEXTBYTE routine for updating the B-buffer value 336B is first executed. The value obtained by shifting the C-register value to the right by 18 bits, namely, the first 6 bits (bits 18 to 23) of the Cb-register and the last 2 bits (bits 24 and 25; the bit 25 at this time is constantly "0") of the Cf-register is substituted into the B-buffer value 336B. The bits 24 and 25 substituted into the B-buffer value 336B are inserted into the arithmetic code 315 as a carry control signal at the position of the first 2 bits of the byte other than X'FF' subsequent to X'FFFFFFFF' (or "X'FF'"s of at least four consecutive bytes), which is the β-buffer value 339β. The bits already output from the C-register or the unnecessary bits (bits 18 to 31) therein are cleared, and the C-register value is shifted to the left by 6 bits so that the most significant bit (bit 17) of the remaining bits (bits 0 to 17) reaches the most significant bit (bit 23) of the Cb-register. B'0000' is set as the value of the F-register 343.

The arithmetic decoder 303 of a one-time 2-bits insertion system shown in FIG. 4 executes the decoding operation by an arithmetic decoding means 306 in accordance with the flowchart shown in FIG. 5.

The function of each routine of INITDEC, the acquisition of MPS and Qe, and DECODE are the same as that used in the arithmetic decoding means 6 of an every-time 1-bit insertion system shown in FIG. 30.

Figure 45:
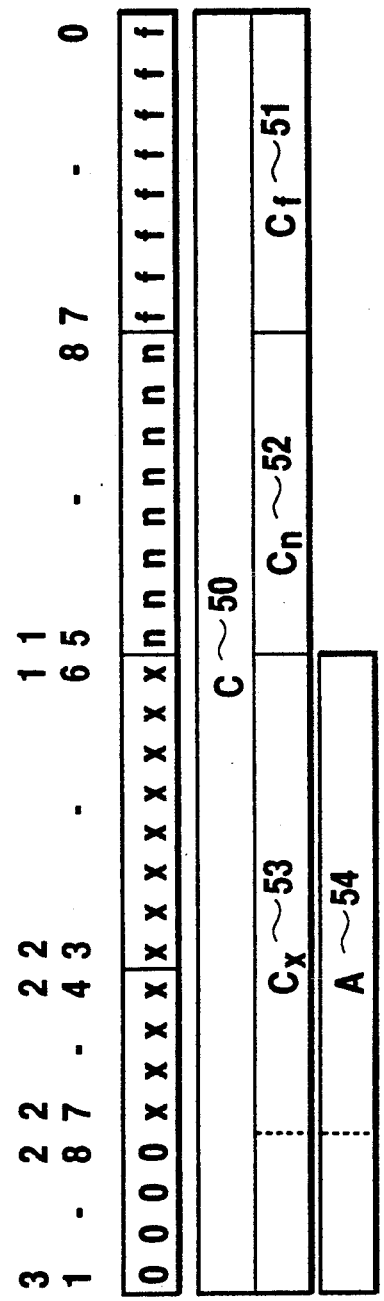
FIG. 45 shows the structure of a C-register and an A-register of the arithmetic decoder shown in FIG. 29.
Figure 46:
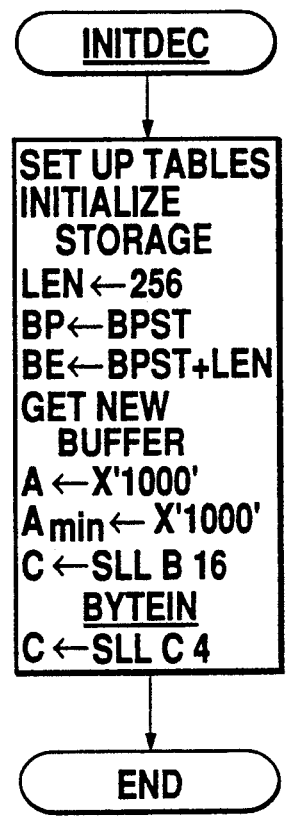
FIG. 46 is a flowchart of INITDEC, which is a routine for initialization at the start of the decoding process of the every-time 1-bit insertion system shown in FIG. 30.

The specifications of a C-register (Cf-register, Cn-register, Cx-register) and an A-register of the arithmetic decoder 303 of a one-time 2-bits insertion system are the same as those of the registers of the arithmetic decoder 3 of an every-time 1-bit insertion system shown in FIG. 45.

Figure 19:
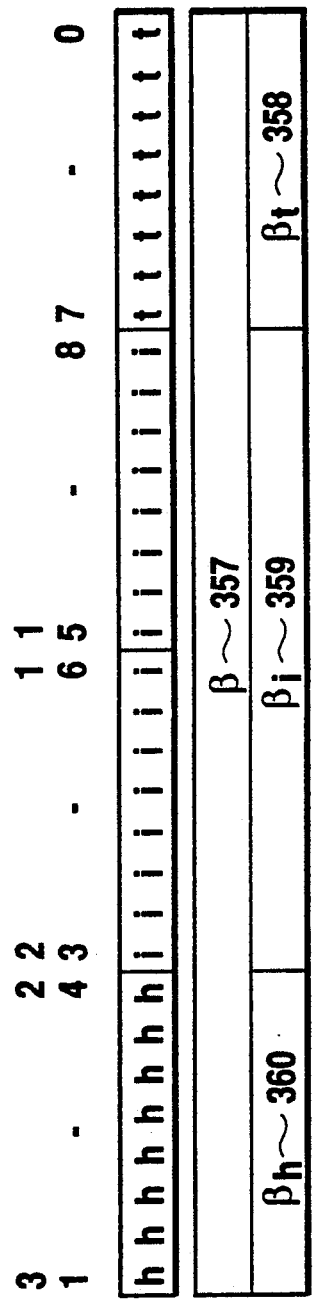
FIG. 19 shows the structure of a 8-buffer of the arithmetic decoder shown in FIG. 4.

A β-buffer 357 is composed of a register of 32 bits, as shown in FIG. 19. The β-buffer 357 is divided into the βt-buffer 358 of bit 0 to bit 7, a βi-buffer 359 of bit 8 to bit 23, and a βh-buffer 360 of bit 24 to bit 31. The β-buffer value 357β is updated prior to the update of the B-buffer value. More specifically, the β-buffer value 357β is shifted to the left by 8 bits, the βh-buffer value 360βh, which has become unnecessary as an input career, is removed, and the B-buffer value is fetched into the βt-buffer 358.

The decoding operation by the arithmetic decoding means 306 of a one-time 2-bits insertion system will be explained with reference to the following flowcharts. The variables and constants used in the flowcharts are the same as those used by the arithmetic decoding means 5 of an every-time 1-bit insertion system except that the β-buffer value is added thereto.

| β | β-buffer value | 357 |
| βt | βt-buffer value (bit 0 to bit 7) | 358 |
| βi | βi-buffer value (bit 8 to bit 23) | 359 |
| βh | βh-buffer value (bit 24 to bit 31) | 360 |

Figure 20:
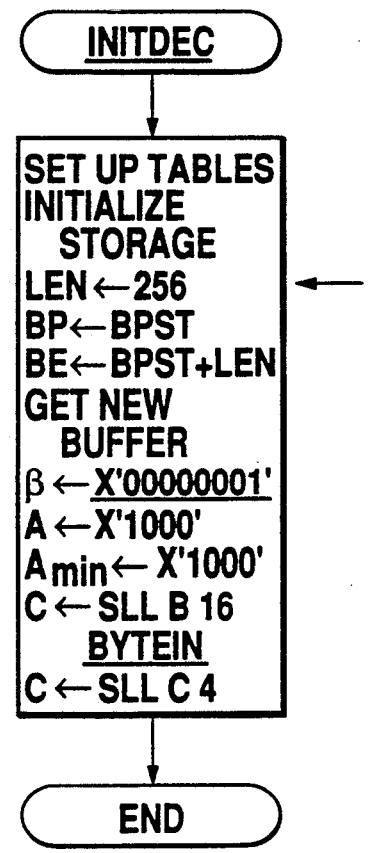
FIG. 20 is a flowchart of INITDEC, which is a routine for initialization at the start of the decoding process of a one-time 2-bits insertion system shown in FIG. 5.

FIG. 20 is a flowchart of the detailed operation of the INITDEC routine for initialization at the start of the decoding process. As shown in FIG. 20, tables are set up and a storage unit is initialized. The arithmetic code buffer is also secured and set up. The buffer pointer BP indicates the first address BPST of the arithmetic code buffer, namely, the position at which the arithmetic code 315 is received by the buffer. The β-buffer value 357β is set to X'00000001' as a value other than X'FFFFFFFF', which has a special meaning. The minimum effective region width Amin is set in the A-register, and Amin is not changed and treated as a constant during the decoding operation. In order to input the arithmetic code 315 into the Cx-register, the B-buffer value is first shifted to the left by 16 bits. A BYTEIN process for inputting the arithmetic code 315 is then executed and the arithmetic code 315 is fetched by the Cn-register. By shifting the C-register value to the left by 4 bits, the Cx-register (12 bits) is initialized. That is, the arithmetic code 315 being decoded is substituted into the Cx-register value.

Figure 47:
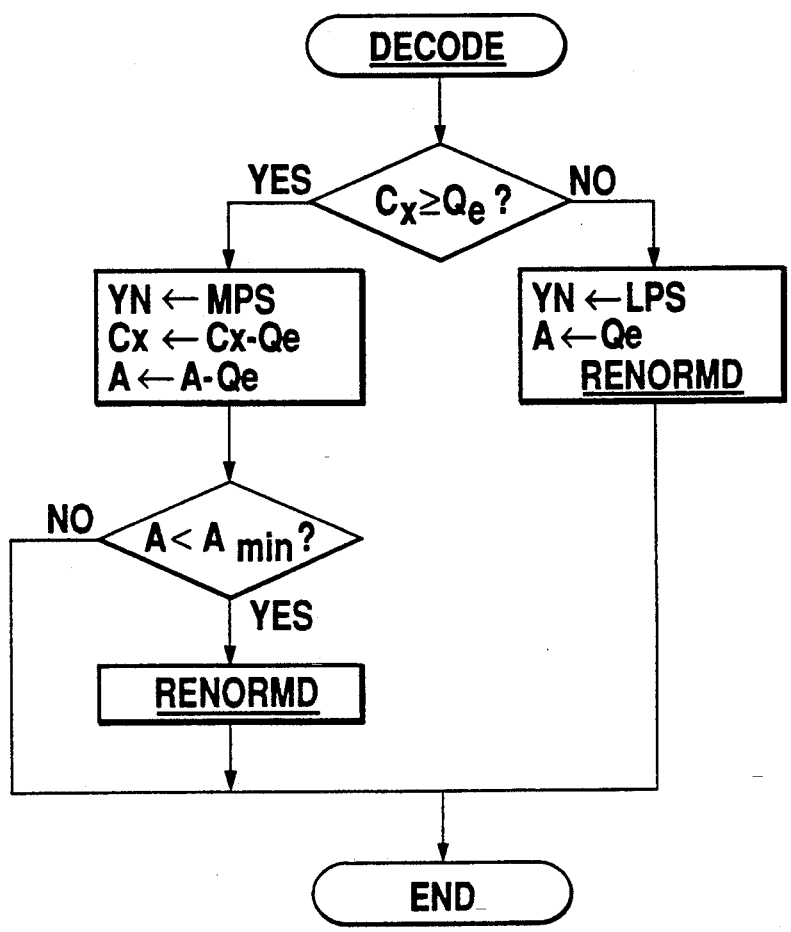
FIG. 47 is a flowchart of DECODE, which is a routine for actually processing the decoding operation shown in FIG. 30.
Figure 48:
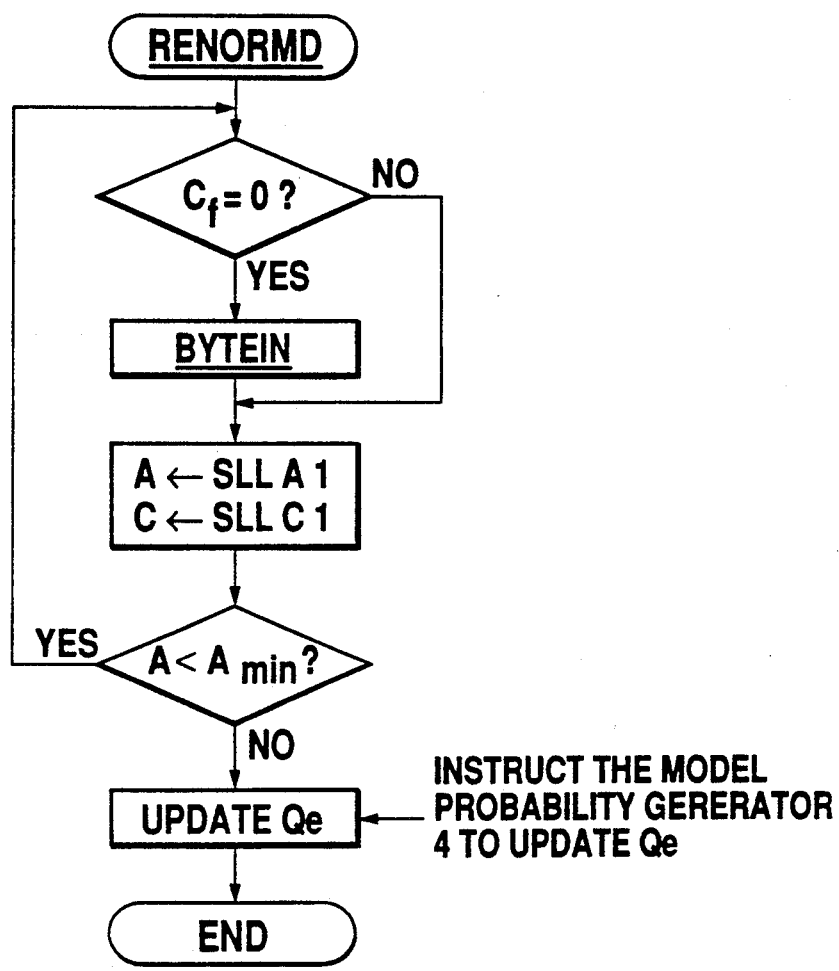
FIG. 48 is a flowchart of RENORMD, which is a routine for renormalization in the decoding process shown in FIG. 47.
Figure 49:
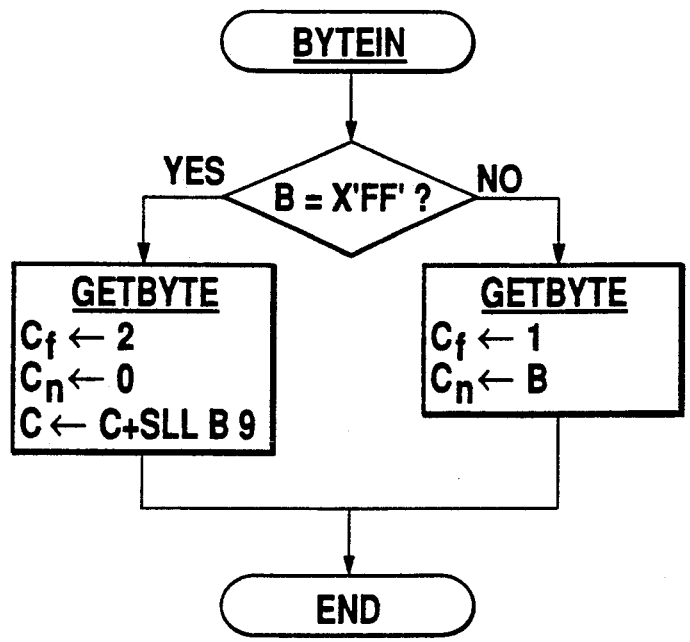
FIG. 49 is a flowchart of BYTEIN, which is a routine for inputting an arithmetic code by an every-time 1-bit insertion system shown.
Figure 50:
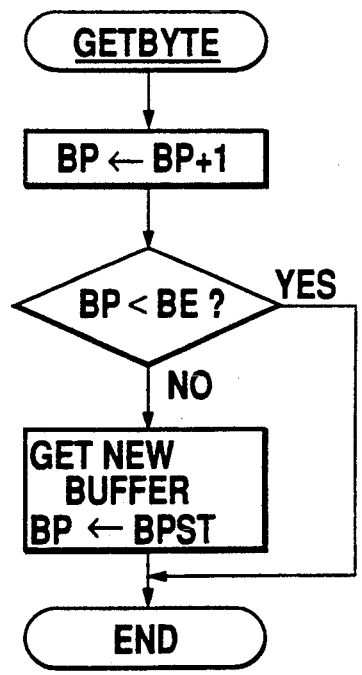
FIG. 50 is a flowchart of GETBYTE, which is a routine for updating a buffer value B by the every-time 1-bit insertion system shown in FIG. 49.

A DECODE routine for actually decoding, and a RENORMD routine for renormalization are executed by the arithmetic decoding means 306 in the same way as those by the arithmetic decoding means 6 of an every-time 1-bit insertion system shown in FIGS. 47 and 48.

Figure 21:
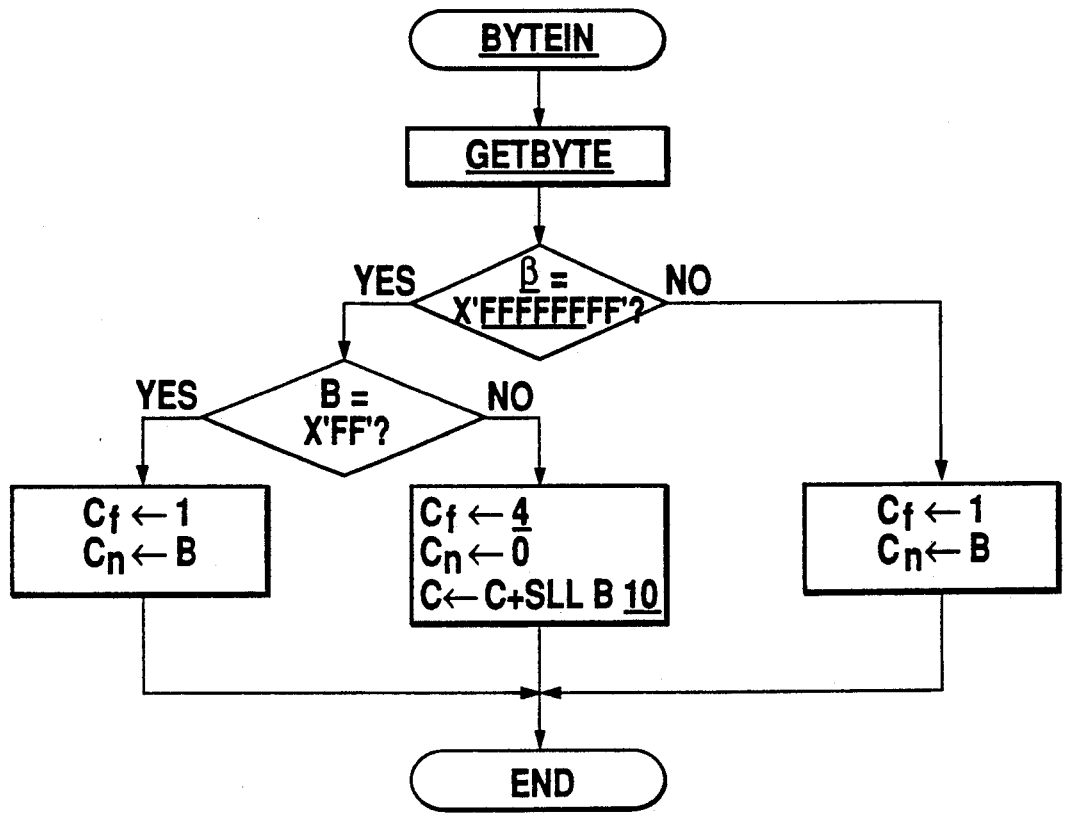
FIG. 21 is a flowchart of BYTEIN, which is a routine for inputting an arithmetic code by the one-time 2-bits insertion system shown in FIG. 8.

FIG. 21 is a flowchart of the detailed operation of the BYTEIN routine for outputting the arithmetic code 315. As shown in FIG. 21, a B-buffer value updating process GETBYTE is first executed.

If the updated β-buffer value 8357 is X'FFFFFFFF', judgment is made as to whether or not the updated B-buffer value is the byte X'FF'. If the updated B-buffer value is the byte X'FF', no carry control signal is included. Therefore, in order to input the arithmetic code 315 after the Cf-register is shifted by 8 bits by renormalization, an input flag "1" is set at the bit 0, and the B-buffer value is substituted as it is into the Cn-register value.

If the updated B-buffer value is not the byte X'FF', a carry control signal is included in the first 2 bits. Therefore, in order to input the arithmetic code 15 after 6 bits are shifted (the carry control signal is removed) in renormalization, an input flag "1" is set at the bit 2, and the Cn-register is cleared. At the same time, the value obtained by shifting the B-buffer value to the left by 10 bits is added to the C-register value, thereby inputting the arithmetic code 315. By adding the carry control signal at the first 2 bits of the B-buffer value (the most significant bit is constantly bit "0") as it is to the last 2 bits of the Cx-register value, the absorbed carry is propagated accurately.

If the β-buffer value 357β is not X'FFFFFFFF', an input flag "1" is set at the bit 0 in order to input the arithmetic code 315 after the Cf-register is shifted by 8 bits by renormalization. At the same time, the B-buffer value is substituted as it is into the Cn-register value.

Figure 22:
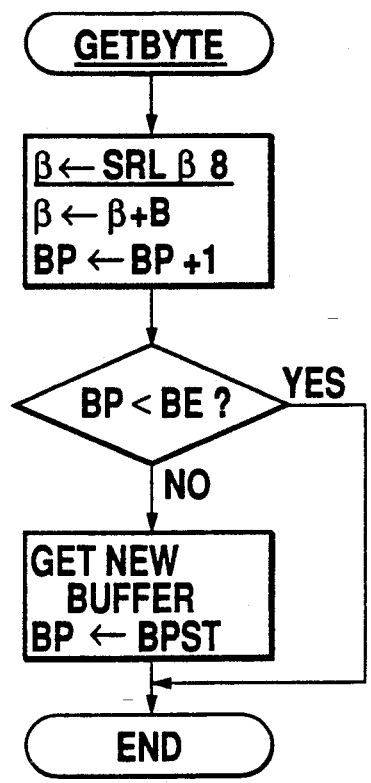
FIG. 22 is a flowchart of GETBYTE, which is a routine for updating a 8-buffer value by the one-time 2-bits insertion system shown in FIG. 21.

FIG. 22 is a flowchart of the detailed operation of the routine GETBYTE for updating the buffer value B in the decoding process. As shown in FIG. 22, the β-buffer value 357β is first shifted to the left by 8 bits and the βh-buffer portion 360 is removed. The B-buffer value is fetched by the βt-buffer 358 so as to update the βt-buffer value 358βt by incrementing the buffer pointer BP by 1. If the buffer pointer BP is not smaller than (i.e., equal to) the last address BE of the arithmetic code buffer, the arithmetic code 315 is received by the arithmetic code buffer, and the buffer pointer BP is reset to the first address BPST of the arithmetic code buffer.

As described above, the code transmitting apparatus of this embodiment has a) a model probability generator on the input side, b) a model probability generator on the output side, c) an arithmetic encoder of a one-time 2-bits insertion system and d) an arithmetic decoder of a one-time 2-bits insertion system. The respective elements have the following structures.

a) The model probability generator on the input side outputs an input value YN of input data supplied from an information source, the predicted value MPS of the occurrence probability of the input value YN and the region width (approximate value thereof) of the complementary LPS (the inverted value, i.e., the complement of the predicted value MPS) The model probability generator on the input side also changes the probability region of the complementary predicted value LPS and updates the LPS region width Qe when a renormalization process is carried out.

b) The model probability generator on the output side outputs the predicted value MPS of the occurrence probability of the output value YN to be decoded and the region width (approximate value thereof) of the complementary LPS, and generates output data from the output value YN. The model probability generator on the output side also changes the probability region of the complementary predicted value LPS and updates the LPS region width Qe when a renormalization process is carried out.

c) The arithmetic encoder of a one-time 2-bits insertion system divides an A-register value, which is an effective region width on a probability number line between 0 and 1, into the LPS region width Qe and the MPS region width (A - Qe) with respect to the input value YN, the predicted value MPS and the complementary predicted value LPS which are supplied from the model probability generator on the input side, and updates the effective region width A to the MPS region width (A - Qe) when the input value YN is equal to the predicted value MPS while it updates the effective region width A to Qe when the input value YN is different from the predicted value MPS. The arithmetic encoder also calculates and updates a C-register value to be the lower boundary value of the updated effective region width A. The arithmetic encoder is provided with a $\beta$-buffer for temporarily storing the arithmetic code which is supplied from the C-register. The $\beta$-buffer propagates a carry generated during the operation of the C-register value. The arithmetic encoder detects a possibility of a carry being propagated beyond at least a predetermined number of consecutive bytes X'FF's (hexadecimal notation) by using the $\beta$-buffer, and when the number of carries exceeds the capacity of $\beta$-buffer, the arithmetic encoder inserts a carry control signal into the first 2 bits of the byte other than X'FF' which occurs immediately after the consecutive bytes X'FF's so as to transmit the presence or absence of a carry. These processings are repeated until the end of the input from the model probability generator on the input side.

d) The arithmetic decoder of a one-time 2-bits insertion system divides an A-register value, which is an effective region width on a probability number line, into the LPS region width Qe and the MPS region width (A - Qe) with respect to the arithmetic code supplied from the arithmetic encoder of a one-time 2-bits insertion system and the predicted value MPS of the occurrence probability of the output value YN to be decoded and the complementary predicted value LPS. The arithmetic decoder is provided with a $\beta$-buffer for temporarily storing the input career of the arithmetic code and detects at least a predetermined number of consecutive bytes X'FF' by using the $\beta$-buffer. The arithmetic decoder fetches the arithmetic code from the C-register by detecting and processing the carry control signal. When the LPS region width Qe allotted to the complementary predicted value LPS is smaller than the C-register value, the arithmetic decoder decodes the output value YN into the predicted value MPS and updates the effective region width A to A-Qe. When the LPS region width Qe allotted to the complementary predicted value LPS is larger than the C-register value, the arithmetic decoder decodes the output value YN into the complementary predicted value LPS, updates the effective region width A to Qe and updates the C-register value so that the lower boundary value of the effective region width A becomes the reference of the arithmetic code. These processings are repeated in series until the end of the supply of the output value YN.

This embodiment adopts a one-time 2-bits insertion system. This system corresponds to a conventional every-time 1-bit insertion system when a pattern of X'FF7FFF7F . . . ' of at least 4 bytes occurs in the arithmetic code 15 and the number of consecutive bytes X'FF's detected by the $\beta$-buffers 339 and 357 of 32 bits (4 bytes) is 4. This case can be regarded as the insertion of 2 bits per 4 bytes. In other words, when each of the $\beta$-buffer 339 and the $\beta$-buffer 357 has 3 bytes (the length of each of the $\beta$i-buffer 341 and the $\beta$i-buffer 359 is 1 byte) and the $\beta$-buffers 339, 357 each having n bytes (n > 3) are provided, if - $\beta$i-buffers 339, 357 each have (n−2) bytes, this embodiment is applicable to the conventional system. If a conventional system for inserting at least 2 bits every time is adopted, this embodiment is applicable thereto merely by providing the $\beta$-buffers 339, 357 each having 1 byte (at the time of encoding, the $\beta$-buffer 339 is unnecessary because it is the same as the B-buffer).

In the first and second embodiments, an arithmetic encoding system is adopted as a method of compressing and expanding data, but the encoding system in the present invention is not limited thereto and a code transmission system provided in the second and third aspect of the present invention may adopt another encoding system.

Although a pattern of consecutive bits "1"s or consecutive bytes X'FF's are detected as a predetermined pattern in the first and second embodiments, different patterns may be used.

In addition, the already transmitted pattern is changed when a carry occurs in the first and second embodiments, but the present invention is not limited to a carry and is applicable to any case in which the already transmitted code pattern is changed or the already transmitted code is controlled in accordance with the result of the subsequent encoding.

In the above-described embodiments, the control signal inserted is 2 bits "01" or "11", but another pattern of another bit length is also usable.

The code transmitting apparatus provided in the first aspect of the present invention adopts a transmission control system (one-time 2-bits insertion system) in which two carry propagation absorbing control bits are inserted once immediately after the end of a 1's run having at least a predetermined length in a code bit for transmitting an arithmetic code. If the maximum admissible number of carries to be propagated is set to twice that in a conventional system, the number of inserted bits is constantly smaller than that in a conventional transmission control system (every-time 1-bit insertion system) in which a carry propagation absorbing control bit is inserted each time, as shown in FIG. 23. As a result, it is possible to reduce the total number of transmitted code bits.

The code transmission system provided in the second and third aspect of the present invention adopts a transmission control system (one-time 2 bits insertion system) in which every time at least a predetermined number of consecutive bytes X'FF's occur in a transmitted arithmetic code, bits "00" or "01" are inserted as a carry control signal into the byte other than X'FF' which occurs immediately thereafter. Therefore, by providing a β-buffer of the same number of bytes as the number of bytes into which the carry control signal of 2 bits is inserted in a conventional system and an F-register of the same number of bytes as the number of the bytes of the β-buffer, the number of inserted carry control signals is reduced in comparison with that in the conventional every-time 1-bit insertion system in which bit "0" or "1" is inserted as a carry control signal into the most significant bit immediately after the byte X'FF'. As a result, it is possible to reduce the total number of transmitted code bits.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A code transmitting apparatus comprising:
    a) an arithmetic encoding means for dividing an effective region width A on a probability number line into the region width A(0) of a more probable symbol (MPS) and the region width A(1) of a less probable symbol (LPS) in accordance with an occurrence probability ratio whenever a symbol of a symbol stream which is supplied from an information source is encoded, for updating a current lower boundary value CR of said effective region width A to a value obtained by adding A(1) thereto and said A to said A(0) when said symbol is a more probable symbol (MPS), while maintaining said CR as is and updating said A to said A(1) when said symbol is a less probable symbol (LPS), and for repeating the dividing and updating processes until the final bit of said symbol stream to serially supply an encoded signal and a carry signal;
    b) an arithmetic decoding means for dividing A into A(0) and A(1) in the same process as by said arithmetic encoding means whenever the encoded symbol stream is decoded into the corresponding symbol, for decoding a code into a more probable symbol (MPS), and for updating a predetermined first plurality of digits DR at the left of the decoding bit of said code to the value with said A(1) subtracted therefrom and said A to said A(0) when said DR is not smaller than said A(1), while decoding said code into a less probable symbol (LPS), maintaining said DR at the current value and also updating said A to said A(1) when said Dr is smaller than said A(1), and repeating the dividing and updating processes until the final bit of said encoded symbol stream to serially generate a decoded symbol stream and to control the propagation of a carry by a control bit detection signal;
    c) a carry transmission control means of one-time 2-bits insertion system for monitoring said encoded signal and said carry signal supplied from said arithmetic encoding means, for inserting two carry propagation absorbing control bits including of a first bit "0" which indicates the end of the continuation of code bits 1's and a second bit "1" or "0" which indicates the presence or absence of a carry from the adjacent digit immediately after the end of the continuation of at least a predetermined number of code bits 1's, and for supplying a code bit stream obtained by the insertion to a transmission path; and
    d) a carry reception control means for a one-time 2-bits insertion system for monitoring said code bit stream supplied from said transmission path, for detecting said carry propagation absorbing control bits "00" or "01" immediately after the end of the continuation of at least a predetermined number of code bits 1's, and for supplying a decoded signal and said control bit detection signal in accordance with said carry propagation absorbing control bits.

2. A code transmission system comprising:
    (a) encoding means for encoding a code;
    (b) transmitting means for transmitting the code encoded by said encoding means; and
    (c) control signal adding means for adding a control signal to a code having a fixed length sequence of bits in a predetermined pattern after the end of the sequence when the code is transmitted, wherein
    if there is one consecutive fixed length sequence having the predetermined pattern, the adding means adds the control signal after the end of the sequence, and
    if there is a plurality of consecutive fixed length sequences having the predetermined pattern, the control signal adding means adds the control signal only after the last of the consecutive sequences.

3. A code transmission system comprising:
    (a) an encoding means for generating a code;
    (b) a detecting means for detecting a sequence in said code having a predetermined pattern and for detecting an end of said sequence in said code;
    (c) adding means, responsive to said detecting means, for adding a control signal to said code only after the end of the continuation of said pattern is detected by said detecting means, wherein,
        if there is one consecutive sequence, said adding means adds said control signal after said sequence,
        if there are a plurality of consecutive sequences, said adding means adds said control signal only after the end of said plurality of consecutive sequences; and
    (d) an outputting means for outputting said code generated by said encoding means and said control signal added thereto by said adding means.

4. The system of claim 2 wherein said sequence comprises a byte having all "1"'s bits.

5. The system of claim 2 wherein the transmitting means comprises:
    a code register for storing bits which are currently encoded;
    an interval register for storing a value representing a current effective region; and
    a buffer for storing a plurality of bytes, for receiving stored bits from the code register, and for propagating a carry detected by the code register.

6. The system of claim 2 wherein the control signal added by said adding means is a carry signal which is added after one or more bytes, wherein each byte has all "1"'s.

7. The system of claim 3 wherein said sequence comprises a byte having all "1"'s bits.

8. The system of claim 3 wherein the transmitting means comprises:
    a code register for storing bits which are currently encoded;

an interval register for storing a value representing a current effective region; and a buffer for storing a plurality of bytes, for receiving stored bits from the code register, and for propagating a carry detected by the code register.

9. The system of claim 3 wherein the control signal added by said adding means is a carry signal which is added after one or more bytes, wherein each byte has all "1"'s.

10. An apparatus comprising:

an arithmetic encoder for encoding a symbol stream by serially supplying an encoded signal and a carry signal;

means, responsive to the carry signal, for inserting a plurality of carry control bits only immediately after the end of an uninterrupted sequence of code bits "1"'s prior to a code bit "0", wherein the uninterrupted sequence has a length greater than a predetermined minimum length; and means for supplying a code bit stream provided by the inserting means to a transmission path.

11. The apparatus of claim 10 wherein the control bits include a first bit "0" which indicates the end of the continuation of code bits "1"'s, and a second bit which indicates the presence or absence of a carry.

12. An arithmetic decoder apparatus for receiving a code bit stream comprising:

means for monitoring the code bit stream having a plurality of carry control bits;

means for detecting the plurality of carry control bits after the end of an uninterrupted sequence of code bits "1"'s prior to a code bit "0", wherein the sequence has a length greater than a predetermined minimum length; and means for supplying a decoded signal and a control bit detection signal in response to the carry control bits.

13. The apparatus of claim 12 wherein the control bits include a first bit "0" which indicates the end of the continuation of code bits "1"'s, and a second bit which indicates the presence or absence of a carry.

14. An apparatus comprising:

an arithmetic encoder for encoding a symbol stream by serially supplying an encoded signal and a carry signal in a number of bytes;

means for detecting a byte having a predetermined composition;

means for inserting a plurality of carry control bits after the end of the byte, wherein, if the detecting means detects a single byte having the predetermined composition, the inserting means inserts the plurality of control bits after the byte, and if the detecting means detects a plurality of consecutive bytes having the predetermined composition, the inserting means inserts the plurality of control bits only after the last of the plurality of consecutive bytes; and means for supplying a code bit stream provided by the inserting means to a transmission path.

15. The apparatus of claim 15 wherein the predetermined composition is all "1"'s.

16. An apparatus comprising:

an arithmetic encoder for encoding a symbol stream by serially supplying an encoded signal and a carry signal;

means for detecting a series of bits having a predetermined composition and a predetermined minimum length;

means for inserting a plurality of carry control bits after the end of the series of bits, wherein, if the detecting means detects a series of bits having the predetermined composition and the minimum length, the inserting means inserts the plurality of control bits after the byte, and if the detecting means detects a continuation of the series beyond the minimum length, the inserting means inserts the plurality of control bits only after the end of the continuation of the series; and means for supplying a code bit stream provided by the inserting means to a transmission path.

17. The apparatus of claim 16 wherein the predetermined composition is a length of "1"'s, wherein the minimum length is the length of one byte, and wherein the continuation of the series is a sequence of uninterrupted "1"'s.

18. A code transmitting apparatus comprising:

an arithmetic encoding means for serially supplying an encoded signal and a carry signal;

an arithmetic decoding means for serially generating a decoded symbol stream and for controlling the propagation of a carry by a control bit detection signal;

one-time multi-bit insertion transmission control means including means for monitoring the encoded signal and the carry signal supplied by the arithmetic encoding means, means for inserting a plurality of carry propagation absorbing control bits which indicate the end of the continuation of code bit 1's and which indicate the presence or absence of a carry, and means for supplying a code bit stream obtained by the insertion to a transmission path; and one-time multi-bit insertion carry reception control means including means for monitoring the code bit stream supplied from the transmission path, means for detecting the carry propagation absorbing control bits immediately after the end of the continuation of at least a predetermined number of code bit 1's, and means for supplying a decoded signal and the control bit detection signal in accordance with the carry propagation absorbing control bits.

* * * * *